United States Patent
Culwell et al.

(10) Patent No.: US 9,729,120 B1
(45) Date of Patent: Aug. 8, 2017

(54) SYSTEM AND METHOD TO MONITOR AUDIO LOUDNESS AND PROVIDE AUDIO AUTOMATIC GAIN CONTROL

(75) Inventors: Kevin S. Culwell, Redondo Beach, CA (US); Daniel M. Miner, Redondo Beach, CA (US); Heather N. Truong, Anaheim, CA (US); Uy X. Nguyen, Hawthorne, CA (US); Leon J. Stanger, Farmington, UT (US); James A. Michener, Grass Valley, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 1247 days.

(21) Appl. No.: 13/182,078

(22) Filed: Jul. 13, 2011

(51) Int. Cl.
   *H03G 3/20* (2006.01)
   *H03G 3/32* (2006.01)
(52) U.S. Cl.
   CPC ..................................... *H03G 3/32* (2013.01)
(58) Field of Classification Search
   CPC .............. G10L 21/0205; G10L 17/005; H04N 21/4788; H04N 7/15; H04N 21/242; H04N 7/17318; H04N 21/6405; H04N 21/812; H04N 5/76; H04N 21/44016; H04N 21/42203; H04N 21/439; H04N 21/84
   USPC .................... 381/56–58, 104–109; 700/94; 348/14.08, 705; 379/91.02
   See application file for complete search history.

(56) References Cited

U.S. PATENT DOCUMENTS

| 3,627,914 A | 12/1971 | Davies |
| 3,843,942 A | 10/1974 | Pierret et al. |
| 4,417,349 A * | 11/1983 | Hills et al. ................. 375/296 |
| 4,934,483 A | 6/1990 | Kallergis |
| 5,337,041 A | 8/1994 | Friedman |
| 5,363,147 A | 11/1994 | Joseph et al. |
| 5,404,315 A | 4/1995 | Nakano et al. |
| 5,424,770 A | 6/1995 | Schmelzer et al. |
| 5,448,568 A | 9/1995 | Delpuch et al. |
| 5,461,619 A | 10/1995 | Citta et al. |
| 5,463,620 A | 10/1995 | Sriram |
| 5,506,844 A | 4/1996 | Rao |
| 5,532,753 A | 7/1996 | Buchner et al. |

(Continued)

FOREIGN PATENT DOCUMENTS

| EP | 1150446 A2 | 10/2001 |
| GB | 2341745 | 3/2000 |

(Continued)

OTHER PUBLICATIONS

Diurnal Sound Control for Personal Computers, IBM Technical Disclosure Bulletin, Oct. 1993, US, p. 549-552.*

(Continued)

*Primary Examiner* — Lun-See Lao
(74) *Attorney, Agent, or Firm* — Fitzgerald & Isaacson, LLP

(57) ABSTRACT

An audio loudness data collection module collects and stores audio data. The data can be stored for a first time period. A monitoring system can access and store the audio data collected and stored by the loudness data collection module according to a second time period. The stored audio data can be processed and displayed to a user in a number of ways. The data can also be used to provide loudness data control. For example, a loudness data control module can perform an audio AGC function to control audio loudness.

20 Claims, 21 Drawing Sheets

(56) References Cited

U.S. PATENT DOCUMENTS

| | | | |
|---|---|---|---|
| 5,541,852 | A | 7/1996 | Eyuboglu et al. |
| 5,579,404 | A | 11/1996 | Fielder et al. |
| 5,583,962 | A | 12/1996 | Davis et al. |
| 5,625,743 | A | 4/1997 | Fiocca |
| 5,650,825 | A | 7/1997 | Naimpally et al. |
| 5,657,454 | A | 8/1997 | Benbassat et al. |
| 5,666,430 | A | 9/1997 | Rzeszewski |
| 5,729,556 | A | 3/1998 | Benbassat et al. |
| 5,751,723 | A | 5/1998 | Vanden Heuvel et al. |
| 5,778,077 | A | 7/1998 | Davidson |
| 5,802,068 | A | 9/1998 | Kudo |
| 5,822,018 | A * | 10/1998 | Farmer .................. 348/705 |
| 5,831,681 | A | 11/1998 | Takahashi et al. |
| 5,854,658 | A | 12/1998 | Uz et al. |
| 5,864,557 | A | 1/1999 | Lyons |
| 5,877,821 | A | 3/1999 | Newlin et al. |
| 5,898,675 | A | 4/1999 | Nahumi |
| 5,912,890 | A | 6/1999 | Park |
| 5,966,120 | A | 10/1999 | Arazi et al. |
| 5,987,031 | A | 11/1999 | Miller et al. |
| 5,991,812 | A | 11/1999 | Srinivasan |
| 6,026,232 | A | 2/2000 | Yogeshwar et al. |
| 6,047,178 | A | 4/2000 | Frlan |
| 6,064,676 | A | 5/2000 | Slattery et al. |
| 6,137,834 | A | 10/2000 | Wine et al. |
| 6,169,584 | B1 | 1/2001 | Glaab et al. |
| 6,169,807 | B1 | 1/2001 | Sansur |
| 6,169,973 | B1 | 1/2001 | Tsutsui et al. |
| 6,188,439 | B1 | 2/2001 | Kim |
| 6,195,438 | B1 | 2/2001 | Yumoto et al. |
| 6,208,666 | B1 | 3/2001 | Lawrence et al. |
| 6,219,043 | B1 | 4/2001 | Yogeshwar et al. |
| 6,252,848 | B1 | 6/2001 | Skirmont |
| 6,259,695 | B1 | 7/2001 | Ofek |
| 6,298,089 | B1 | 10/2001 | Gazit |
| 6,369,855 | B1 | 4/2002 | Chauvel et al. |
| 6,389,019 | B1 | 5/2002 | Fan et al. |
| 6,429,779 | B1 | 8/2002 | Petrillo et al. |
| 6,430,233 | B1 | 8/2002 | Dillon et al. |
| 6,560,496 | B1 | 5/2003 | Michener |
| 6,687,247 | B1 | 2/2004 | Wilford et al. |
| 6,765,867 | B2 | 7/2004 | Shanley et al. |
| 6,801,886 | B1 | 10/2004 | Pai et al. |
| 6,931,370 | B1 | 8/2005 | McDowell |
| 6,961,954 | B1 | 11/2005 | Maybury et al. |
| 6,987,858 | B2 | 1/2006 | Aoki et al. |
| 7,035,278 | B2 | 4/2006 | Bertram et al. |
| 7,110,558 | B1 * | 9/2006 | Elliott ....................... 381/105 |
| 7,283,965 | B1 | 10/2007 | Michener |
| 7,647,221 | B2 | 1/2010 | Michener |
| 7,707,613 | B1 * | 4/2010 | Wugofski et al. ............. 725/80 |
| 7,831,054 | B2 * | 11/2010 | Ball et al. ................... 381/104 |
| 7,912,226 | B1 | 3/2011 | James et al. |
| 2001/0016048 | A1 | 8/2001 | Rapeli |
| 2001/0027393 | A1 | 10/2001 | Touimi et al. |
| 2001/0047256 | A1 | 11/2001 | Tsurushima et al. |
| 2001/0047267 | A1 | 11/2001 | Abiko et al. |
| 2002/0004718 | A1 | 1/2002 | Hasegawa et al. |
| 2002/0085584 | A1 | 7/2002 | Itawaki et al. |
| 2002/0129140 | A1 | 9/2002 | Peled et al. |
| 2002/0146023 | A1 | 10/2002 | Myers |
| 2002/0150057 | A1 | 10/2002 | McClary |
| 2002/0169599 | A1 | 11/2002 | Suzuki |
| 2002/0173864 | A1 | 11/2002 | Smith |
| 2004/0028281 | A1 | 2/2004 | Cheng et al. |
| 2004/0199933 | A1 | 10/2004 | Ficco |
| 2006/0120518 | A1 * | 6/2006 | Baudino ............ H04L 67/1095 379/91.02 |
| 2006/0247928 | A1 * | 11/2006 | Cowdery ....................... 704/229 |
| 2009/0073961 | A1 * | 3/2009 | Jayapalan et al. ............. 370/352 |
| 2011/0019839 | A1 * | 1/2011 | Nandury ...................... 381/107 |
| 2011/0293113 | A1 * | 12/2011 | McCarthy ................ H03G 3/32 381/107 |

FOREIGN PATENT DOCUMENTS

| | | |
|---|---|---|
| JP | 10284960 | 10/1998 |
| JP | 2001-111969 | 4/2001 |
| JP | 2001169248 | 6/2001 |
| WO | 99/53612 | 10/1999 |
| WO | 01/30086 | 4/2001 |

OTHER PUBLICATIONS

Bhaskaran, V. ED-Institute of Electrical and Electronics Engineers; "Mediaprocessing in the Compressed Domain"; Digest of Papers of COMPCON (Computer Society Corporation); 1996 Technologies for the Information Superhighway; Santa Clara; Feb. 25-28, 1996; Digest of Papers of the Computer Society Computer Conference COMPCON; Los Alamitos; IEEE Comp. Soc. Press; vol. Conf. 41; Feb. 25, 1996; pp. 204-209; XP010160896-ISBN:0-8186-7414-8.

Brandenburg, K. et al; "ISO-MPEG-1 Audio: A Generic Standard for Coding of High-Quality Digital Audio"; Journal of the Audio Engineering Society, Audio Engineering Society; New York, US; vol. 42, No. 10; Oct. 1994; pp. 780-782; XP000978167-ISSN: 0004-7554.

Hans, M. et al; "An MPEG Audio Layered Transcoder"; Preprints of Papers Presented at the AES Convention; Sep. 1998; pp. 1-18; XP001014304.

Govindan et al.; "Scheduling and IPC Mechanisms for Continuous Media"; 13th ACM Symposium on Operating Systems Principles; 1991; 13 pages.

Notice of Allowance dated May 22, 2014 in U.S. Appl. No. 13/053,019, filed Mar. 21, 2011 by Thomas H. James et al.

Non-final Office action dated Apr. 9, 2013 in U.S. Appl. No. 13/053,019, filed Mar. 21, 2011 by Thomas H. James et al.

Non-final Office action dated Dec. 31, 2008 in U.S. Appl. No. 10/660,952, filed Sep. 12, 2003 by Thomas H. James et al.

Non-final Office action dated Jul. 1, 2008 in U.S. Appl. No. 10/660,952, filed Sep. 12, 2003 by Thomas H. James et al.

Final Rejection dated Jan. 10, 2008 in U.S. Appl. No. 10/660,952, filed Sep. 12, 2003 by Thomas H. James et al.

EPO Communication dated Jul. 26, 2005 in European Patent Application No. 04252531.1 filed Apr. 30, 2004 by James A. Michener.

EPO Communication dated Jan. 27, 2006 in European Patent Application No. 04252531.1 filed Apr. 30, 2004 by James A. Michener.

EPO extended European search report dated Jan. 22, 2007 in European Patent Application No. 06076046.9 filed Apr. 30, 2004 by James A. Michener.

Smith, Nigel; "Satellite Data Broadcasting—An End to the World-Wide Wait?"; NDS Data Broadcasting Article; 1997 The Institute of Electrical Engineers; published by IEE, Savoy Place, London, United Kingdom; pp. 6/1-6/11; XP6502899.

Non-final Office action dated Nov. 28, 2007 in U.S. Appl. No. 10/426,664, filed Apr. 30, 2003 by James A. Michener.

Notice of Allowance dated Aug. 24, 2009 in U.S. Appl. No. 10/426,664, filed Apr. 30, 2003 by James A. Michener.

Final Rejection dated Jun. 10, 2009 in U.S. Appl. No. 10/426,664, filed Apr. 30, 2003 by James A. Michener.

Non-final Office action dated Dec. 22, 2008 in U.S. Appl. No. 10/426,664, filed Apr. 30, 2003 by James A. Michener.

Non-final Office action dated Jun. 4, 2008 in U.S. Appl. No. 10/426,664, filed Apr. 30, 2003 by James A. Michener.

De Smet, Patrick; Stichele, Thomas Vander; "Subband Based MPEG Audio Mixing for Internet Streaming Applications"; 2001; Acoustics, Speech, and Signal Processing Proceedings (ICASSP '01); 2001 IEEE International Conference; vol. 3, pp. 1393-1396; IEEE.

Final Rejection dated Feb. 14, 2014 in U.S. Appl. No. 13/053,019, filed Mar. 21, 2011 by Thomas H. James et al.

* cited by examiner

| SCID | Broadcast ID | 1 Week Avg. (loudness) | 08-03-2010 Tue | 08-04-2010 Wed | 08-05-2010 Thu | 08-06-2010 Fri | 08-07-2010 Sat | 08-08-2010 Sun | 08-09-2010 Mon |
|---|---|---|---|---|---|---|---|---|---|
| 11 | n/a | -17.2 dB | -17.2 | -17.3 | -17.3 | -17.2 | -17.0 | -16.9 | -17.4 |
| 21 | n/a | -13.4 dB | -13.3 | -13.1 | -13.4 | -13.3 | -13.6 | -14.0 | -13.3 |
| 31 | n/a | -16.8 dB | -16.6 | -16.8 | -16.9 | -16.9 | -16.6 | -16.7 | -17.4 |
| 41 | n/a | -17.6 dB | -17.6 | -17.6 | -17.5 | -17.6 | -17.5 | -17.5 | -17.5 |
| 51 | n/a | -21.4 dB | -21.1 | -21.5 | -21.0 | -21.2 | -22.0 | -21.5 | -21.8 |
| 61 | n/a | -20.1 dB | -20.4 | -20.1 | -20.0 | -20.1 | -19.6 | -20.3 | -20.1 |
| 81 | n/a | -16.3 dB | -16.6 | -16.5 | -16.1 | -16.5 | -15.8 | -16.4 | -16.4 |
| 121 | n/a | -20.8 dB | -20.8 | -20.8 | -20.8 | -20.9 | -20.7 | -20.9 | -20.5 |

| SCID | Broadcast ID | 1 Week Avg. (loudness, gain offset) | 08-03-2010 Tue | 08-04-2010 Wed | 08-05-2010 Thu | 08-06-2010 Fri | 08-07-2010 Sat | 08-08-2010 Sun | 08-09-2010 Mon |
|---|---|---|---|---|---|---|---|---|---|
| 11 | n/a | -0.2 dB, -14.0 dB | -0.2, -14.0 | -0.3, -14.0 | -0.3, -14.0 | -0.2, -14.0 | 0.0, -14.0 | 0.1, -14.0 | -0.4, -14.0 |
| 21 | n/a | 1.6 dB, -16.0 dB | 1.7, -16.0 | 1.9, -16.0 | 1.6, -16.0 | 1.7, -16.0 | 1.4, -16.0 | 1.0, -16.0 | 1.7, -16.0 |
| 31 | n/a | 0.2 dB, -14.0 dB | 0.4, -14.0 | 0.2, -14.0 | 0.1, -14.0 | 0.1, -14.0 | 0.4, -14.0 | 0.3, -14.0 | -0.4, -14.0 |
| 41 | n/a | 1.4 dB, -12.0 dB | 1.4, -12.0 | 1.4, -12.0 | 1.5, -12.0 | 1.4, -12.0 | 1.5, -12.0 | 1.5, -12.0 | 1.5, -12.0 |
| 51 | n/a | -0.4 dB, -10.0 dB | -0.1, -10.0 | -0.5, -10.0 | 0.0, -10.0 | -0.2, -10.0 | -1.0, -10.0 | -0.5, -10.0 | -0.8, -10.0 |
| 61 | n/a | 0.9 dB, -10.0 dB | 0.6, -10.0 | 0.9, -10.0 | 1.0, -10.0 | 0.9, -10.0 | 1.4, -10.0 | 0.7, -10.0 | 0.9, -10.0 |
| 81 | n/a | 0.7 dB, -14.0 dB | 0.4, -14.0 | 0.5, -14.0 | 0.9, -14.0 | 0.5, -14.0 | 1.2, -14.0 | 0.6, -14.0 | 0.6, -14.0 |
| 121 | n/a | 0.2 dB, -10.0 dB | 0.2, -10.0 | 0.2, -10.0 | 0.2, -10.0 | 0.1, -10.0 | 0.3, -10.0 | 0.1, -10.0 | 0.5, -10.0 |

| PID | Broadcast ID | 1 Week Avg. (loudness, dial norm) | 09-06-2010 Mon | 09-07-2010 Tue | 09-08-2010 Wed | 09-09-2010 Thu | 09-10-2010 Fri | 09-11-2010 Sat | 09-12-2010 Sun |
|---|---|---|---|---|---|---|---|---|---|
| 0x1012 | KCNC-TV | -29.8 dB, VAR | -29.8, -31.0 | -30.0, -31.0 | -29.8, -31.0 | -29.8, -31.0 | -30.1, -31.0 | -29.6, -31.0 | -29.4, -31.0 |
| 0x1022 | KMGH-DT | -25.2 dB, -27 | -25.1, -27.0 | -25.2, -27.0 | -25.1, -27.0 | -25.2, -27.0 | -25.2, -27.0 | -25.4, -27.0 | -25.1, -27.0 |
| 0x1032 | KUSA-DT | -24.6 dB, -27 | -24.8, -27.0 | -24.7, -27.0 | -24.5, -27.0 | -24.5, -27.0 | -24.6, -27.0 | -24.2, -27.0 | -24.7, -27.0 |
| 0x1042 | KDVR DT | -24.7 dB, VAR | -24.9, -26.7 | -24.8, -26.8 | -24.4, -26.8 | -25.0, -26.8 | -25.0, -26.8 | -24.9, -26.4 | -23.7, -25.8 |
| 0x1052 | Univisi | -24.8 dB, -27 | -25.2, -27.0 | -24.5, -27.0 | -24.4, -27.0 | -24.5, -27.0 | -24.9, -27.0 | -25.0, -27.0 | -25.3, -27.0 |

| PID | Broadcast ID | 1 Week Avg. (loudness, gain offset) | 09-06-2010 Mon | 09-07-2010 Tue | 09-08-2010 Wed | 09-09-2010 Thu | 09-10-2010 Fri | 09-11-2010 Sat | 09-12-2010 Sun |
|---|---|---|---|---|---|---|---|---|---|
| 0x1012 | KCNC-TV | -1.8 dB, 0.0 dB | -1.8, 0.0 | -2.0, 0.0 | -1.8, 0.0 | -1.8, 0.0 | -2.1, 0.0 | -1.6, 0.0 | -1.4, 0.0 |
| 0x1022 | KMGH-DT | -0.2 dB, 1.0 dB | -0.1, 1.0 | -0.2, 1.0 | -0.1, 1.0 | -0.2, 1.0 | -0.2, 1.0 | -0.4, 1.0 | -0.1, 1.0 |
| 0x1032 | KUSA-DT | 0.4 dB, 1.0 dB | 0.2, 1.0 | 0.3, 1.0 | 0.5, 1.0 | 0.5, 1.0 | 0.4, 1.0 | 0.8, 1.0 | 0.3, 1.0 |
| 0x1042 | KDVR-DT | -0.1 dB, 1.0 dB | -0.2, 1.0 | -0.0, 1.0 | 0.3, 1.0 | -0.2, 1.0 | -0.2, 1.0 | -0.4, 1.0 | -0.1, 1.0 |
| 0x1052 | Univisi | 0.2 dB, 1.0 dB | -0.2, 1.0 | 0.5, 1.0 | 0.6, 1.0 | 0.5, 1.0 | 0.1, 1.0 | 0.0, 1.0 | -0.3, 1.0 |

| Status PID | Loudness (db) | Loudness (PSec) | Gain (dB) | Bit Rate | Dialnorm In (dB) | Dialnorm Out (dB) |
|---|---|---|---|---|---|---|
| 247-4194: | -1.5dB | 0.713870pSec | 2dB | 402368bps | -23 | -25 |

Figure 9b

SYSTEM AND METHOD TO MONITOR AUDIO LOUDNESS AND PROVIDE AUDIO AUTOMATIC GAIN CONTROL

TECHNICAL FIELD

Embodiments relate to improving an entertainment experience in television broadcast systems. More particularly, embodiments relate to monitoring and controlling audio loudness in television programming broadcast to subscribers.

BACKGROUND

Television broadcast systems, such as satellite television broadcast systems, permeate virtually every aspect of daily life in modern society. As a result, such television broadcast systems have become an important, and in some cases, necessary fixture of modern living. Today, many television service providers, such as satellite service providers, provide programming from numerous sources. These sources include national, local, and specialty sources. A problem facing such television service providers is harmonizing audio levels provided by the various television programming sources. Without such harmonization, audio issues manifest themselves in several ways. For example, different channels can have different base audio levels. This can be quite disconcerting to a user who must constantly adjust channel volume when switching between channels whose sources provide different base audio levels.

A challenge facing television service providers attempting to address this problem is the lack meaningful audio monitoring systems for conventional television broadcast systems. Typically, conventional television broadcast system monitoring employs a hardware device such as the Dolby® LM100 ("LM100") to determine audio loudness at a particular time. Using the ITU-R BS 1770 standard for audio loudness, the LM100 displays audio loudness in units of LKFS, where 1 LKFS equals 1 dB.

However, hardware devices such as the LM 100 are of limited utility for monitoring and controlling audio levels to efficiently address audio harmonization issues. For example, the LM100 can monitor only one channel in a television broadcast system at any given time. Even monitoring a single channel is problematic because two devices are required per channel—one to monitor source input for the channel, and one to monitor broadcast output for the channel. Trying to overcome this problem using a sufficient number of hardware monitoring devices in a television broadcast system presents its own set of problems, primarily in the enormous cost that would be associated with the effort. By way of example, in a satellite system, channels are assigned to transports that corresponding to satellite transponders used to broadcast television programming to subscribers. Each transport can support up to 15 television channels. Thus, up to 30 LM 100s would be required to fully monitor a particular transport. Monitoring audio levels in modern satellite television systems having hundreds of transports carrying thousands of channels would require thousands of LM 100s. Clearly, this is impractical from both a cost and logistics viewpoint. Consequently, typical convention systems monitor only a few of the available channels in a television broadcast system.

Another limitation of conventional hardware devices is that generally they do not provide historical perspectives of audio loudness and dialnorm. For example, the LM 100 provides only long term averages, for example, average loudness over a week. As a result, it is difficult or impossible to determine trends in audio loudness over time. Moreover, conventional hardware television broadcast system monitoring systems typically provide statistics on-site only. As a result, in conventional systems, only broadcast operations personnel at a specific broadcast location can access the measurements. This makes it difficult or impossible to provide the required data to remote personnel whom might be better able to solve audio loudness issues.

Further, in modern satellite systems, data to be broadcast is generally processed by a transport processing system. Prior transport processing systems process have limited capabilities to monitor video and audio data carried by channels in a particular transport, for example, a satellite transponder. While prior transport processing systems provide some data concerning audio in each channel of the transport, they do not provide historical data collection. As a result, prior transport processing systems provide only an estimate of audio level for a particular channel at a particular time. Moreover, the audio estimate provided by prior transport processing systems is not very accurate.

Industry recommendations for audio loudness have been promulgated. For example, the ATSC Recommended Practice: Technique for Establishing and Maintaining Loudness for Digital Television, Document A/85:2009 (Nov. 4, 2009) ("ATSC A/85"), which is incorporated herein by reference in its entirety, provides guidelines for audio loudness for standard definition ("SD") and high definition ("HD") television.

However, the ATSC A/85 contains differences in the recommendations of audio loudness for audio associated with SD services (MPEG-1, layer II audio) and audio associated with high definition HD services (AC-3 audio). More specifically, the ATSC A/85 recommends a −24 dB target audio loudness for MPEG-1, layer II audio (SD) channels and a −31 dB target audio loudness for AC-3 audio (HD) channels. Thus, even where sources providers follow the ATSC A/85 recommendations, SD channels are typically 7 dB louder than HD channels. Thus, a subscriber switching from an SD channel to an HD channel or vice versa will likely notice a large volume difference, despite not adjusting the volume his or herself.

Even more problematic is that not all source providers follow the ATSC A/85 recommendations. As a result, large audio loudness differences in audio data provided by disparate source providers are often observed. This can result in wide audio loudness variations even when switching from one HD channel to another HD channel or from one SD channel to another SD channel or when switching from local service providers to national service providers, etc.

For example, weekly averages of AC-3 CONUS (Continental US) audio loudness have been observed ranging from −38 dB to −22 dB; weekly averages of SD Legacy CONUS audio loudness have been observed ranging from −32 dB to −16 dB; weekly averages of AC-3 SLiL (Spotbeam local-into-local) have been observed ranging from −40 dB to −12 dB; and weekly averages of SD Legacy SLiL have been observed ranging from −32 dB to −4 dB. Even though average loudness may not vary that much from the target recommended loudness levels, the wide ranges can produce extremely annoying effects for subscribers. For example, switching from a station with an average loudness of −32 dB to a station with an average loudness of −4 dB would likely startle a subscriber due to the large volume increase, and could possibly damage equipment, for example, damage a speaker.

The disconcerting effects associated with varying audio loudness can manifest themselves in a number of situations. For example, a subscriber may be watching an SD channel, start recording an HD channel, and then decide to watch the HD channel. Because the volume of the HD channel will likely be too low if both the SD and HD sources adhere to the ATSC A/85 recommendations, the subscriber will increase the volume to view the HD channel. When HD channel recording stops either because the program has completed or the subscriber terminates the recording early, the television may revert back to the SD channel. In such a case, the volume will rise dramatically due to the 7 dB target loudness difference between the HD and SD channels. Not only might the subscriber be startled, but he or she will have to lower the volume. This constant volume adjustment can be frustrating to subscribers, in particular, because they are not doing anything to change volume.

In another example, television service providers may receive audio from a source in one format but desire recode the received audio in another format for broadcast. For example, for some channels, a service provider may receive audio in an AC-3 audio format, but desire to recode it in an MPEG-1, layer II audio format. This requires first decoding the input format. With respect to AC-3, for example, there are two modes of decoding—RF mode and line mode. In line mode decoding, no gain offset applied. However, when performing RF mode decoding, the decoder applies an 11 dB increase to the audio to address signal-to-noise issues. As a result, even more acute sound differences can result when switching between SD and HD channels than described above with respect to the 7 dB difference, again with the annoying requirement to adjust volume, not to mention the startling effect an 11 dB volume increase may have.

These changes in loudness levels can be disconcerting and annoying to subscribers, particularly where they have not performed any action to change audio loudness. In many cases, the audio loudness change causes subscribers to believe there is a malfunction with their systems. As a result, subscriber calls and complaints to service providers may very likely increase. Without proper tools to monitor and control audio loudness, inefficiencies in terms of wasted technician hours, call center hours, and the like, will likely result in increased cost, and lower subscriber satisfaction.

SUMMARY

What is required therefore is a system and method to overcome the foregoing issues with conventional television broadcast system audio monitoring and control systems.

In an embodiment, audio loudness data is stored by a transport processing system. In an embodiment, the data is stored for a time period, such as 5 minutes. A monitoring system obtains the stored data. In an embodiment, the data is obtained periodically, for example, every 2 minutes. In another embodiment, rather than collect all stored data periodically, a portion of the stored data is collected periodically. For example in an embodiment, a 2- or 3-minute portion of the data is collected every minute. The monitoring system can process and display the obtained data. In an embodiment, the monitoring system appends the obtained data to a file containing audio loudness data previously obtained by the monitoring system.

In an embodiment, a loudness control module controls audio loudness data using audio automatic gain control. Audio loudness data obtained by the transport processing system for a period is averaged and stored as a sample average. In an embodiment, the averaging period is one hour. If a sufficient number of sample averages are available, the sample averages are averaged and stored. In an embodiment, at least 4 averages are required. The resulting average is compared to a target loudness baseline. An adjustment is determined based on any difference between the average and the target loudness baseline. The adjustment can be used to normalize the audio data to the target loudness baseline. Applying the AGC to all available channels in a transport or even an entire system allows normalization of the channels to a common target loudness baseline.

In an embodiment, a system processes and displays audio loudness data. The system includes a monitor to obtain audio loudness data stored at a remote location associated with a transport processing system. In the embodiment, the monitor is configured to obtain the data and store the data historically so that it can be processed and displayed to a user. An audio automatic gain control can be added to control audio loudness data in the system.

In another embodiment, a method monitors audio loudness in a transport processing system. The method comprises obtaining audio loudness data stored on the transport processing system using a device located remotely to the transport processing system. In the embodiment, the obtained audio loudness data is stored along with data previously obtained from the transport processing system by the remote device. In addition, in the embodiment, the method includes displaying the stored obtained audio loudness data to a user. In another embodiment, the method further includes performing an audio automatic gain control to control audio loudness.

Additional features and embodiments of the present invention will be evident in view of the following detailed description of the invention.

BRIEF DESCRIPTION OF THE DRAWINGS

FIG. 4b illustrates an exemplary table corresponding to the data shown in graphical representation of FIG. 4a that can be displayed to a user according to an embodiment of the present invention.

FIG. 5b illustrates a table corresponding to the data shown in the graphical representation of FIG. 5a according to an embodiment of the present invention.

FIG. 6b illustrates an exemplary table corresponding to the data shown in exemplary graphical representation of FIG. 6a according to an embodiment of the present invention.

FIG. 7b illustrates a table corresponding to the data shown in the graphical representation of FIG. 7a according to an embodiment of the present invention.

FIG. 9b illustrates an exemplary file structure used to store data returned by a TPS in response to a STATUS AUDIO command for AC-3 audio data according to an embodiment of the present invention.

DETAILED DESCRIPTION

Figure 1:
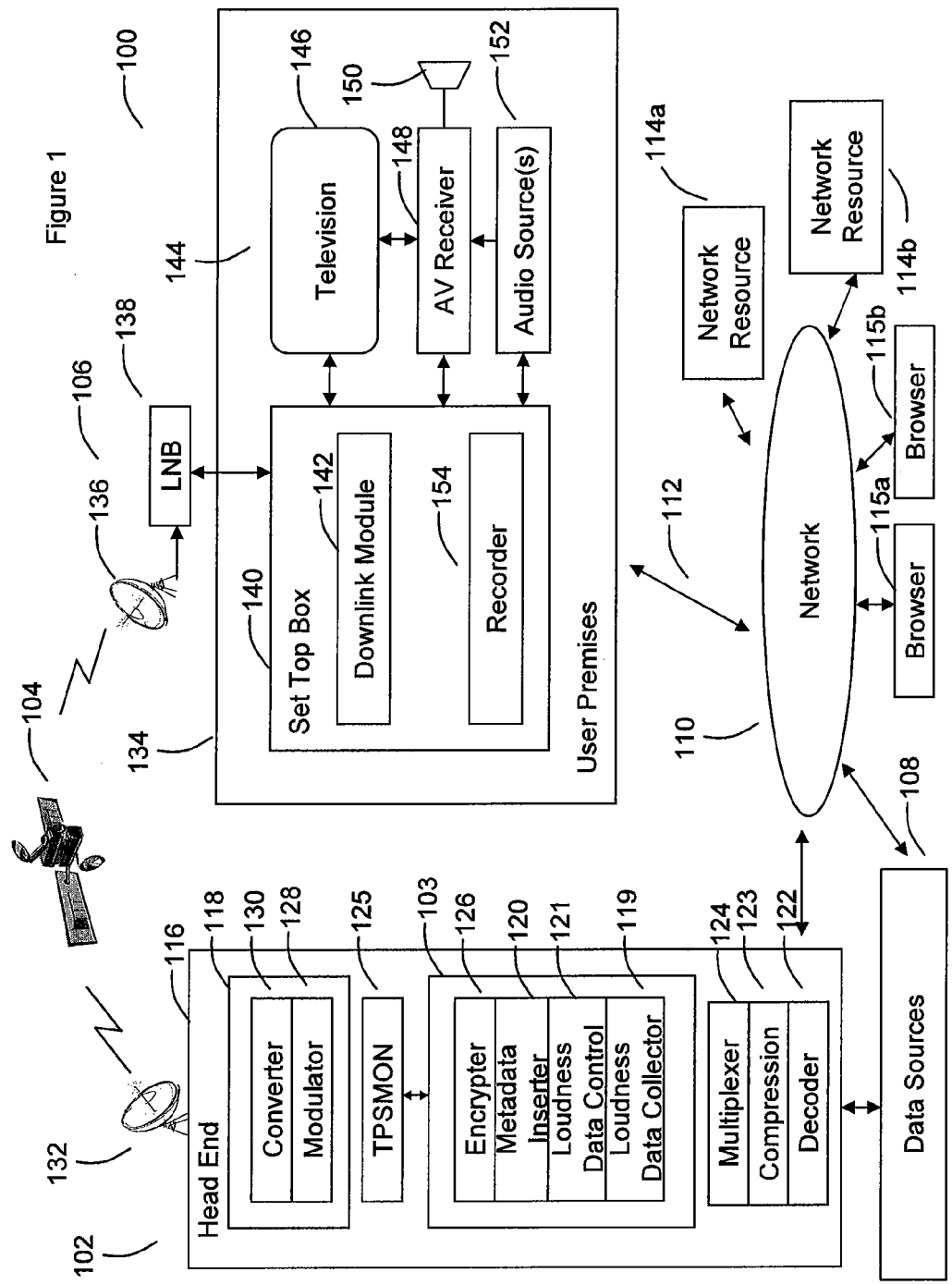
FIG. 1 is a schematic diagram of an exemplary system for monitoring audio loudness across all channels in a television broadcast system according to an embodiment of the present invention.

FIG. 1 is a schematic diagram of an exemplary system 100 for monitoring audio loudness across all channels in a television broadcast system, such as a television satellite service provider, according to an embodiment. As shown in FIG. 1, exemplary system 100 is an example direct-to-home (DTH) transmission and reception system 100. The example DTH system 100 of FIG. 1 generally includes a transmission station 102, a satellite/relay 104, and a plurality of receiver stations, one of which is shown at reference numeral 106, between which wireless communications are exchanged at any suitable frequency (e.g., Ku-band, Ka-band, and reverse band frequencies). As described in detail below with respect to each portion of the system 100, information from one or more of a plurality of data sources 108 is transmitted from transmission station 102 to satellite/relay 104. Satellite/relay 104 may be at least one geosynchronous or geo-stationary satellite. In turn, satellite/relay 104 rebroadcasts the information received from transmission station 102 over broad geographical area(s) including receiver station 106. Example receiver station 106 is also communicatively coupled to transmission station 102 via a network 110. Network 110 can be, for example, the Internet, a local area network (LAN), a wide area network (WAN), a conventional public switched telephone network (PSTN), and/or any other suitable network system. A connection 112 (e.g., a terrestrial link via a telephone line) to network 110 may also be used for supplemental communications (e.g., software updates, subscription information, programming data, information associated with interactive programming, etc.) with transmission station 102 and/or may facilitate other general data transfers between receiver station 106 one or more network resources 114a and 114b, such as, for example, file servers, web servers, and/or databases (e.g., a library of on-demand programming).

Data sources 108 receive and/or generate video, audio, and/or audiovisual programming including, for example, television programming, movies, sporting events, news, music, pay-per-view programs, advertisement(s), game(s), etc. In the illustrated example, data sources 108 receive programming from, for example, television broadcasting networks, cable networks, advertisers, and/or other content distributors. Further, example data sources 108 may include a source of program guide data that is used to display an interactive program guide (e.g., a grid guide that informs users of particular programs available on particular channels at particular times and information associated therewith) to an audience. Users can manipulate the program guide (e.g., via a remote control) to, for example, select a highlighted program for viewing and/or to activate an interactive feature (e.g., a program information screen, a recording process, a future showing list, etc.) associated with an entry of the program guide. Further, example data sources 108 include a source of on-demand programming to facilitate an on-demand service.

An example head-end 116 includes a decoder 122 and compression system 123, a transport processing system (TPS) 103 and an uplink module 118. In an embodiment, decoder 122 decodes the information by for example, converting the information into data streams. In an embodiment, compression system 123 compresses the bit streams into a format for transmission, for example, MPEG-2 or MPEG-4. In some cases, AC-3 audio is not decoded, but passed directly through without first decoding. In such cases, only the video portion of the source data is decoded.

In an embodiment, multiplexer 124 multiplexes the data streams generated by compression system 123 into a transport stream so that, for example, different channels are multiplexed into one transport. Further, in some cases a header is attached to each data packet within the packetized data stream to facilitate identification of the contents of the data packet. In other cases, the data may be received already transport packetized.

TPS 103 receives the multiplexed data from multiplexer 124 and prepares the same for submission to uplink module 118. TPS 103 includes a loudness data collector 119 to collect and store audio loudness data in audio provided by data sources 108, and provide the data to a TPS monitoring system in response to requests for the data. TPS 103 also includes a loudness data control module 121 to perform loudness control (e.g., audio automatic gain control (AGC)) on audio data received from data source 108 as described in more detail below. Generally, example metadata inserter 120 associates the content with certain information such as, for example, identifying information related to media content and/or instructions and/or parameters specifically dedicated to an operation of one or more audio loudness operations. As described below, for example, in an embodiment, metadata inserter 120 replaces scale factor data in the MPEG-1, layer II audio data header and dialnorm in the AC-3 audio data header in accordance with adjustments made by loudness data control module 121.

A TPS monitor application (TPSMON) executes on a computer 125. Computer 125 can be an computer configured to execute a TPSMON application as described herein. As described in more detail below, the TPSMON application accesses the TPS 103 to obtain data stored therein so that it can be provided to users who request it. In an embodiment, the TPSMON is configured to access the data stored on TPS 103 automatically. There may be one or more than one TPSMON application for a given facility. For example, in an embodiment, there is a TPSMON application for each TPS. In other embodiments, a single TPSMON application may service more than one TPS.

In the illustrated example, the data packet(s) are encrypted by an encrypter 126 using any suitable technique capable of protecting the data packet(s) from unauthorized entities.

Uplink module 118 prepares the data for transmission to satellite/relay 104. In an embodiment, uplink module 118 includes a modulator 128 and a converter 130. During operation, encrypted data packet(s) are conveyed to modulator 128, which modulates a carrier wave with the encoded information. The modulated carrier wave is conveyed to converter 130, which, in the illustrated example, is an uplink frequency converter that converts the modulated, encoded bit stream to a frequency band suitable for reception by satellite/relay 104. The modulated, encoded bit stream is then routed from uplink frequency converter 130 to an uplink antenna 132 where it is conveyed to satellite/relay 104.

Satellite/relay 104 receives the modulated, encoded bit stream from the transmission station 102 and broadcasts it downward toward an area on earth including receiver station 106. Example receiver station 106 is located at a subscriber premises 134 having a reception antenna 136 installed thereon that is coupled to a low-noise-block downconverter (LNB) 138. LNB 138 amplifies and, in some examples, downconverts the received bitstream. In the illustrated example of FIG. 1, LNB 138 is coupled to a set-top box 140. While the example of FIG. 1 includes a set-top box, the example methods, apparatus, systems, and/or articles of manufacture described herein can be implemented on and/or in conjunction with other devices such as, for example, a personal computer having a receiver card installed therein to enable the personal computer to receive the media signals described herein, and/or any other suitable device. Additionally, the set-top box functionality can be built into an A/V receiver or a television 146.

Example set-top box 140 receives the signals originating at head-end 116 and includes a downlink module 142 to process the bitstream included in the received signals. Example downlink module 142 demodulates, decrypts, demultiplexes, decodes, and/or otherwise processes the bitstream such that the content (e.g., audiovisual content) represented by the bitstream can be presented on a display device of, for example, a media presentation system 144. Example media presentation system 144 includes a television 146, an AV receiver 148 coupled to a sound system 150, and one or more audio sources 152. As shown in FIG. 1, set-top box 140 may route signals directly to television 146 and/or via AV receiver 148. In an embodiment, AV receiver 148 is capable of controlling sound system 150, which can be used in conjunction with, or in lieu of, the audio components of television 146. In an embodiment, set-top box 140 is responsive to user inputs to, for example, to tune a particular channel of the received data stream, thereby displaying the particular channel on television 146 and/or playing an audio stream of the particular channel (e.g., a channel dedicated to a particular genre of music) using the sound system 150 and/or the audio components of television 146. In an embodiment, audio source(s) 152 include additional or alternative sources of audio information such as, for example, an MP3 player (e.g., an Apple® iPod®), a Blu-eray® player, a Digital Versatile Disc (DVD) player, a compact disc (CD) player, a personal computer, etc.

Further, in an embodiment, example set-top box 140 includes a recorder 154. In an embodiment, recorder 154 is capable of recording information on a storage device such as, for example, analog media (e.g., video tape), computer readable digital media (e.g., a hard disk drive, a digital versatile disc (DVD), a compact disc (CD), flash memory, etc.), and/or any other suitable storage device.

One or more computers having a browser execution thereon can access data from TPS 103 collected and stored by TPSMON application 125. The browsers are remote applications that execute on remote computers 115a and 115b. Exemplary such browsers include Microsoft Internet Explorer® and Mozilla FireFox®. For example, in an embodiment, computers 115a and 115b access data stored by the TPS for viewing via the TPSMON application using commands according to the TELNET protocol over network 110. In this manner audio loudness monitoring can be performed remotely by personnel not co-located with TPS 103.

Figure 2:
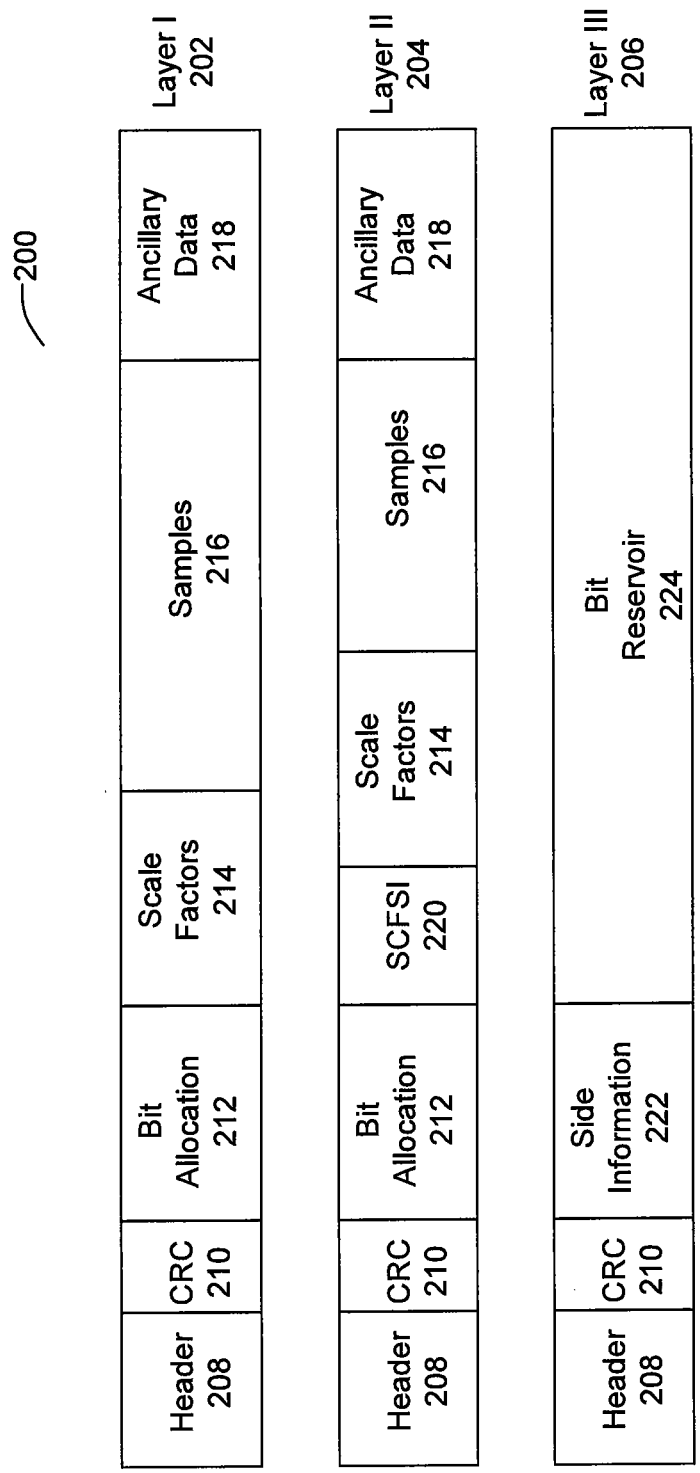
FIG. 2 is a block diagram illustrating the frame structure of an exemplary MPEG-1 audio data stream.

Audio data is provided in audio data streams. The audio data streams are described briefly for MPEG-1 and AC-3 audio data. FIG. 2 is a block diagram illustrating the frame structure of an MPEG-1 audio data stream 200. Layers I, II and III within the MPEG-1 audio data stream 200 are shown as separate frames 202, 204 and 206.

Each frame 202, 204 and 206 includes a header 208, which is followed by an optional cyclic redundancy check (CRC) 210 that is 16 bits in length. Header 208 is 32 bits and includes the following information: sync word—12 bits (all 1s), system word—20 bits, version id—1 bit, layer—2 bits, error protection—1 bit, bit rate index—4 bits, sampling frequency rate index—2 bits, padding—1 bit, private—1 bit, mode—2 bits, mode extension—2 bits, copyright—1 bit, original or copy—1 bit, and emphasis—2 bits. The CRC 210, if present, is used for detecting errors.

In the frame 202 of layer I, the CRC 210 is followed by a bit allocation 212 (128-256 bits in length), scale factors 214 (0-384 bits in length), samples 216 (384 bits in length), and ancillary data 218. In the frame 204 of layer II, the CRC 210 is followed by a bit allocation 212 (26-188 bits in length), scale factor selection information (SCFSI) 220 (0-60 bits in length), scale factors 214 (0-1080 bits in length), samples 216 (1152 bits in length), and ancillary data 218. In the frame 206 of layer III, the CRC 210 is followed by side information 222 (136-256 bits in length) and a bit reservoir 224.

Bit allocation 212 determines the number of bits per sample for layer I, or the number of quantization levels for layer II. Specifically, bit allocation 212 specifies the number of bits assigned for quantization of each sub-band. These assignments are made adaptively, according to the information content of the audio signal, so bit allocation 212 varies in each frame 202, 204. Samples 216 can be coded with zero bits (i.e., no data are present), or with two to fifteen bits per sample.

Scale factors 214 are coded to indicate sixty-three possible values that are coded as six-bit index patterns from "000000" (0), which designates the maximum scale factor, to "111110" (62), which designates the minimum scale factor. Each sub-band in samples 216 has an associated scale factor 214 that defines the level at which each sub-band is recombined during decoding.

Samples 216 comprise compressed audio data for each of thirty-two sub-bands. A layer I frame 202 comprises twelve samples per sub-band. A layer II frame 204 comprises thirty-six samples per sub-band.

In layer II frame 204, samples 216 in each frame are divided into three parts, wherein each part comprises twelve samples per sub-band. For each sub-band, the SCFSI 220 indicates whether the three parts have separate scale factors 214, or all three parts have the same scale factor 214, or two parts (the first two or the last two) have one scale factor 214 and the other part has another scale factor 214.

During decompression, samples 216 are provided to an inverse quantizer, which selects predetermined values according to bit allocation 212 and performs a dequantization operation, wherein the dequantized values are then multiplied by the scale factors 214 to obtain denormalized values. Thus, if all the sub-band scale factors 214 are changed, the audio level will be altered. Moreover, these changes to scale factors 214 can be made without alteration to the compressed audio data in the sub-bands.

In an embodiment, the input to the loudness algorithm is obtained from samples 216 in MPEG-1, layer II 204. MPEG-1, layer II includes header information, scale factors, and data samples. In an embodiment, the scale factors can be updated to adjust audio loudness. Data from other layers of the MPEG-1 audio stream could be used within the scope and spirit of the present invention. However, the algorithm may have to be modified to accommodate different data types in other layers.

Figure 3:
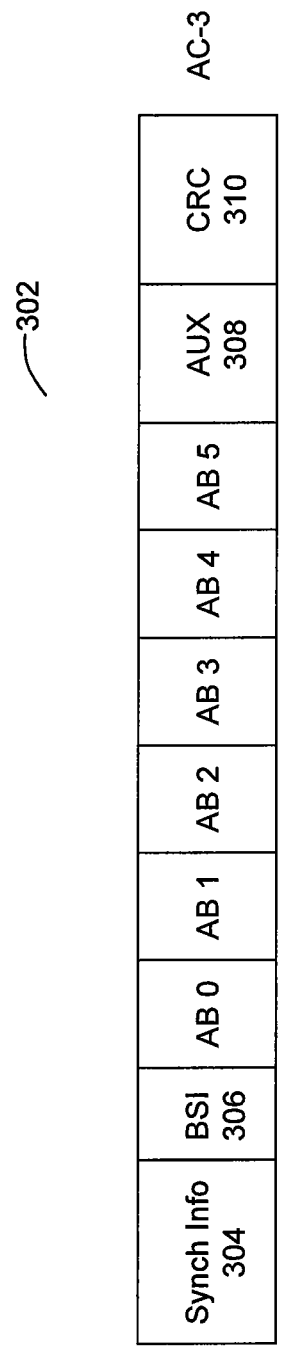
FIG. 3 is a block diagram illustrating the frame structure of an exemplary AC-3 audio data stream.

AC-3 audio is Dolby digital standard. FIG. 3 is a block diagram illustrating an exemplary frame structure for AC-3 audio frame 302. As shown in FIG. 3, the AC-3 audio bit stream is coded in a series of synchronization frames. Each synchronization frame includes 6 audio blocks AB 0 through AB 5. Each audio block represents 256 new audio samples per channel. A synchronization information header 304 at the beginning of each frame contains information needed to acquire and maintain synchronization. A bit stream information (BSI) header 306 follows the SI and contains parameters that describe the coded audio service. The coded audio blocks may be followed by an auxiliary data (AUX) field 308. An error check field 310 ends frame 302. Error check field 310 can include a CRC word used for error detection. Dialnorm, which can be used to control loudness, can be found in BSI 306. In an embodiment, dialnorm has a range of −31 to −1 dB, where loudness diminishes towards −1 dB. Additional information concerning the AC-3 audio frame structure can be found in ATSC Document A/52C, Digital Audio Compression Standard (AC-3, E-AC-3) (Jun. 14, 2005), which is incorporated by reference herein in its entirety.

In an embodiment, loudness data collector 119 in TPS 103 uses audio data obtained from an input MPEG-1, layer II (SD) or an AC-3 (HD) audio data stream to derive loudness data. In an embodiment, for example, loudness data collector 119 uses the ITU-R BS 1770 standard for audio loudness to calculate loudness from the audio data. This is the same calculation as employed by the LM100, thus maintaining compatibility with LM100 data. Using the derived loudness data, loudness data control module 121 can determine loudness adjustments to make to an input data stream to achieve a target audio loudness.

In an embodiment, loudness data collector 119 determines loudness data for each channel TPS 103 processes to determine audio loudness for the channel at a particular time. As described in more detail below loudness data is calculated at periodic intervals and stored for a particular time period. The periodic interval can be predetermined or user selected. For example, in an embodiment, the periodic interval for calculating loudness data is 5 seconds, and the particular time period for storing the data 5 minutes.

In an embodiment, loudness data collector 119 is implemented on a server computer, such as a server personal computer. Accordingly, data collected by loudness data collector 119 can be accessed electronically either remotely or using a computer co-located with TPS 103. For example, in an embodiment, data collected by loudness data collector 119 is accessed via commands issued during a TELNET session. For example, a remote application (e.g., a TPSMON application) executing on a client computer that may be remote from TPS 103 such as remote client computers 115*a* or 115*b*, can communicate with TPS 103 to obtain data stored calculated and stored by loudness monitor 103 for the previous 5 minutes. In an embodiment, for example, the TPSMON application is configured to obtain and store the previous 5 minutes of loudness data from TPS 103 every 2 or 3 minutes. The access intervals can be predetermined or user-selected. In another embodiment, the TPSMON application is configured to obtain and store a portion of the data stored by the TPS. For example, in an embodiment, the TPSMON is configured to collect a 2- or 3-minute portion of the stored data every minute. The portion of the data and periodic collection period can be predetermined or user-selected. As described in more detail below, the TPSMON application organizes the data for presentation in a user-friendly fashion.

In an embodiment, the TPSMON application stores the audio data collected by loudness data collector 119 so that historical data concerning any channel broadcast by a television broadcasting systems can be provided to uses. For example, the TPSMON application can provide the audio loudness for one or more channels for a given time window. In one embodiment, the time window is a 1-week time window. For example, the TPSMON application can provide the audio loudness for the prior week. In addition, TPSMON can present the data at any desired resolution down to the collection interval. For example, in an embodiment having a 5-second data sampling interval, TPSMON can present the data down to a 5 second resolution.

As described above, in an embodiment, TPS monitoring is performed using a web-based application, such as the TPSMON application. The web-based application can execute on one or more computers. The one or more computer may be remote from a TPS they are monitoring, such as computer 115*a* and 115*b*, and/or co-located with the TPS they are monitoring. The web-based application allows loudness information to be accessed from anywhere by anyone having access to the network. For example, access may be obtained over the Internet. As a result, those responsible for monitoring and controlling audio loudness do not have to be co-located at the site where audio data is collected to collected and control audio loudness.

According to an embodiment, in operation, a client running a TPS monitoring application connects to a TPS so that it can obtain loudness data collected by the TPS. In an embodiment, for example, a TPSMON application executing on computer 125 connects to the TPS using the TELNET protocol. Once connected, a user can execute one or more TELNET commands to extract audio loudness data collected and stored by TPS 103. In another embodiment, the TPSMON application is configured to execute the TELNET commands to extract the audio loudness data automatically. For example, in an embodiment, the TPSMON application is configured to automatically periodically execute TELNET commands to extract the audio loudness data.

While all derived loudness data can be stored by TPS 103 and collected by a TPSMON application, as described above, in an embodiment, TPS 103 stores five (5) minute snapshots of the derived audio loudness data. That is, TPS stores a rolling 5-minute history of derived audio loudness data. A TPSMON application then collects the audio loudness data stored by TPS 103 every two (2) minutes. Collecting the data every two minutes provides overlap to prevent data loss. It would be apparent to those skilled in the art that the 5- and 2-minute collection intervals are design specific and can be modified as appropriate for a particular implementation.

In another embodiment, the TPSMON application periodically collects a portion of the stored data. For example, in an embodiment, the TPSMON application stores a 2- or a 3-minute portion of the 5-minute rolling window of data. In an embodiment, the TPSMON application performs this collection every minute. In an embodiment, once the data is collected, the TPSMON application compares the data to stored data to determine an overlap. The TPSMON discards the newly acquired data that overlaps and stores the portion of the newly acquired data after the overlap. For example, in an embodiment, the newly acquired data after any overlapping portion is appended to previously stored data.

Once the TPSMON application collects the data, it is stored in a file. The stored data can be viewed in a number of ways. For example, the data can be viewed in its raw form or processed in some manner. Exemplary processing includes averaging over a time period such as 1 day or 1 hour, skipping data points, smoothing, filtering, scaling, and performing operations on multiple channels, such as addition and subtraction, and any other operation on one or more channels.

In an embodiment, TPS 103 samples the audio loudness data at a sample interval. For example, in an embodiment, TPS samples the data at 5-second sample intervals. In such an embodiment, therefore, TPS 103 stores 60 samples of loudness data per channel per 5 minute interval. The sampling interval can be adjusted to fit a particular application. Thus, a shorter or greater than 5-second sampling interval can be used as suitable for a particular application.

Figure 4A:
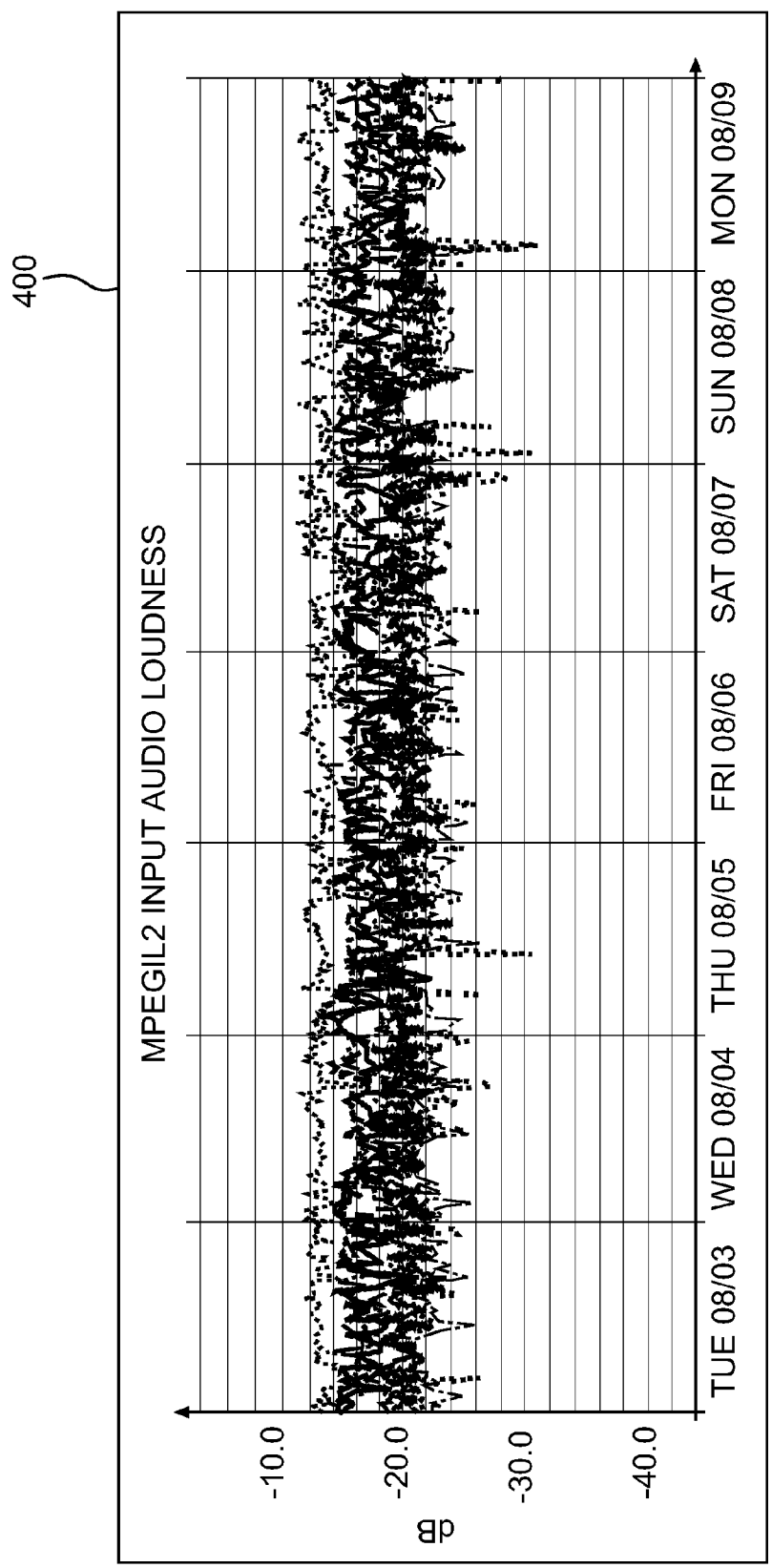
FIG. 4a is an exemplary graphical representation of exemplary audio loudness data for MPEG-1 layer 2 audio data as input to a transport processing system (TPS) according to an embodiment of the present invention.

FIG. 4a is an exemplary graphical representation 400 of exemplary audio loudness data for MPEG-1 layer 2 audio data as input to a TPS for processing that can be displayed to a user according to an embodiment. In graphical representation 400, the exemplary audio loudness data was collected at 5-second intervals for 8 channels. As can be seen, graphical representation 400 allows users to see the audio data over time. In the exemplary data set of FIG. 4a, the data collection period was a week. Any desired view period can be selected by a user, including, for example, a day, a part of a day, a week, several weeks, or other time frame. In an embodiment, different colors are used to represent the different channels. In an embodiment, a user can select one or more of the channels for viewing in separate screen on in an overlay screen by clicking on the one or more channels. As described above, a user can perform various operations on one or more of the channels prior to viewing.

FIG. 4b illustrates an exemplary table 420 corresponding to the data shown in graphical representation 400 that can be displayed to a user according to an embodiment. In exemplary table 420, the SCID is the channel ID corresponding to collected audio data. Table 420 illustrates average audio loudness for the week and for each day included in the weekly average.

In an embodiment the audio loudness values in table 420 are color coded to indicate how they compare to a target audio loudness. In FIG. 4b, for example, the target audio loudness is that provided in ATSC A/85 for MPEG-1, layer II (−24 dB). For example, in an embodiment, the average audio loudness is shown in black (no color change) if the difference between the average audio loudness and the target audio loudness is less than 3.0 db. If the difference between the average audio loudness and the target audio loudness is greater or equal to 3.0 db, but less than 6.0 dB, the average audio loudness is displayed in yellow. If the difference between the average audio loudness and the target audio loudness is greater or equal to 6.0 dB, the average audio loudness is displayed in red. The ranges, number of ranges, and colors can be changed as desired for a particular implementation.

Using an audio loudness color scheme emphasizes where audio loudness problems may be occurring. For example, weekly or daily averages of greater or equal to 6.0 dB differences between average audio loudness and target audio loudness stand out more clearly when presented in red in an embodiment of the present invention.

Figure 5A:
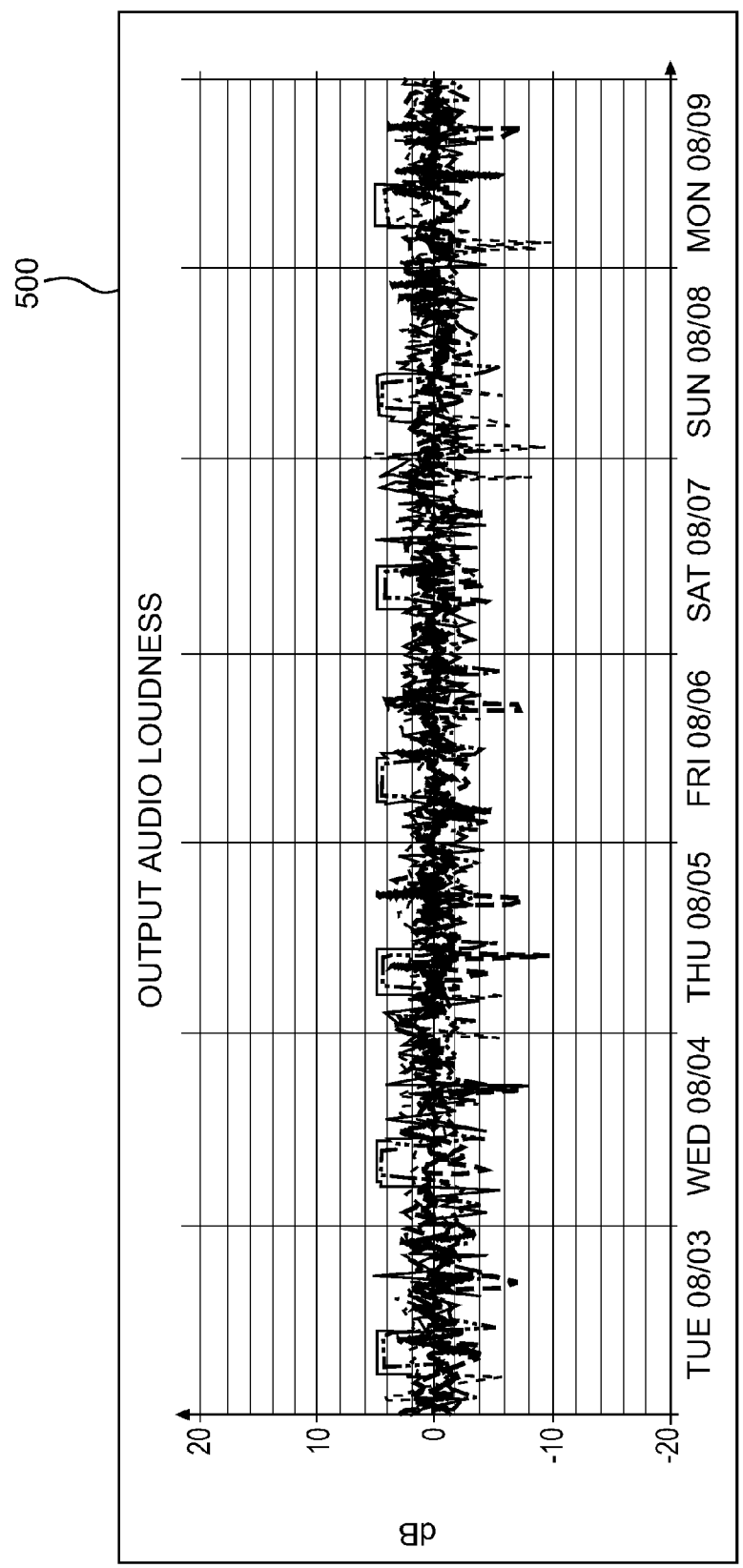
FIG. 5a is a graphical representation of exemplary audio loudness data for MPEG-1, layer II output after processing by TPS for broadcast for the 8 channels of input data shown in FIG. 4a according to an embodiment of the present invention.

In an embodiment, the data representative of the input is derived from the output data (as shown, for example, in FIG. 5a). For example, to determine the input data corresponding to output data, the offsets applied by TPS to derive the output data are removed. Thus, to derive input audio data for MPEG-1, layer II audio (as shown for example in FIG. 4a), starting with the output audio data for MPEG-1, layer II audio (as shown for example in FIG. 5a), the −26 dB normalization offset is removed. In addition, any gain offset applied is removed. In an embodiment, the gain offset can be gain applied to make an average loudness equal to a target and/or any gain applied by an audio loudness AGC (described below). The resulting value is the input audio loudness data value. In an embodiment, the conversion from output data to input data is performed by TPSMON from output data provided by the TPS.

FIG. 5a is a graphical representation 500 of exemplary audio loudness data for MPEG-1, layer II output after processing by TPS for broadcast for the 8 channels of input data shown in FIG. 4a according to an embodiment. The displayed output data has also had an audio AGC applied (described in more detail below). As can be seen, the audio loudness monitoring allows users to view the audio data over time. In the exemplary data set of FIG. 5a, the data collection period was a week. Any desired view period can be selected by a user, including, for example, a day, a part of a day, a week, several weeks, or other time frame. In an embodiment, different colors are used to represent the different channels. In an embodiment, a user can select one or more of the channels for viewing in separate screen on in an overlay screen by clicking on the one or more channels. As described above, a user can perform various operations on one or more of the channels prior to viewing.

FIG. 5b illustrates a table 520 corresponding to the data shown in the graphical representation 500 according to an embodiment. In exemplary table 520, the SCID is the channel ID for the particular a particular data stream. Exemplary table 520 illustrates average audio loudness for the week and for each day included in the weekly average. In an embodiment, a gain offset (described in more detail below) is also included in table 520. As described in more detail below, the gain offset is the gain applied to a particular channel to achieve a target audio loudness and/or gain applied by an audio AGC (described below). For example, in an embodiment, the target loudness for audio loudness data is 0 dB. In such an embodiment, 0 dB corresponds to −26 dB for MPEG-1, layer II audio data and −28 dB for AC-3 audio data.

As described above, in an embodiment the gain offset values are color coded to indicate how much gain was required to bring a particular channel to the target loudness. For example, in an embodiment, the gain offset is shown in black (no color change) if the offset is less than 3.0 db. If the gain offset is greater or equal to 3.0 db, but less than 6.0 dB, the offset is displayed in orange. If the gain offset is greater or equal to 6.0 dB, the gain offset is displayed in red. The ranges, number of ranges, and colors can be changed as desired for a particular implementation.

Using the gain color scheme emphasizes where audio loudness problems may be occurring. For example, weekly or daily averages of greater or equal to 6.0 dB of applied gain will stand out much more clearly in red in an embodiment of the present invention.

Figure 6A:
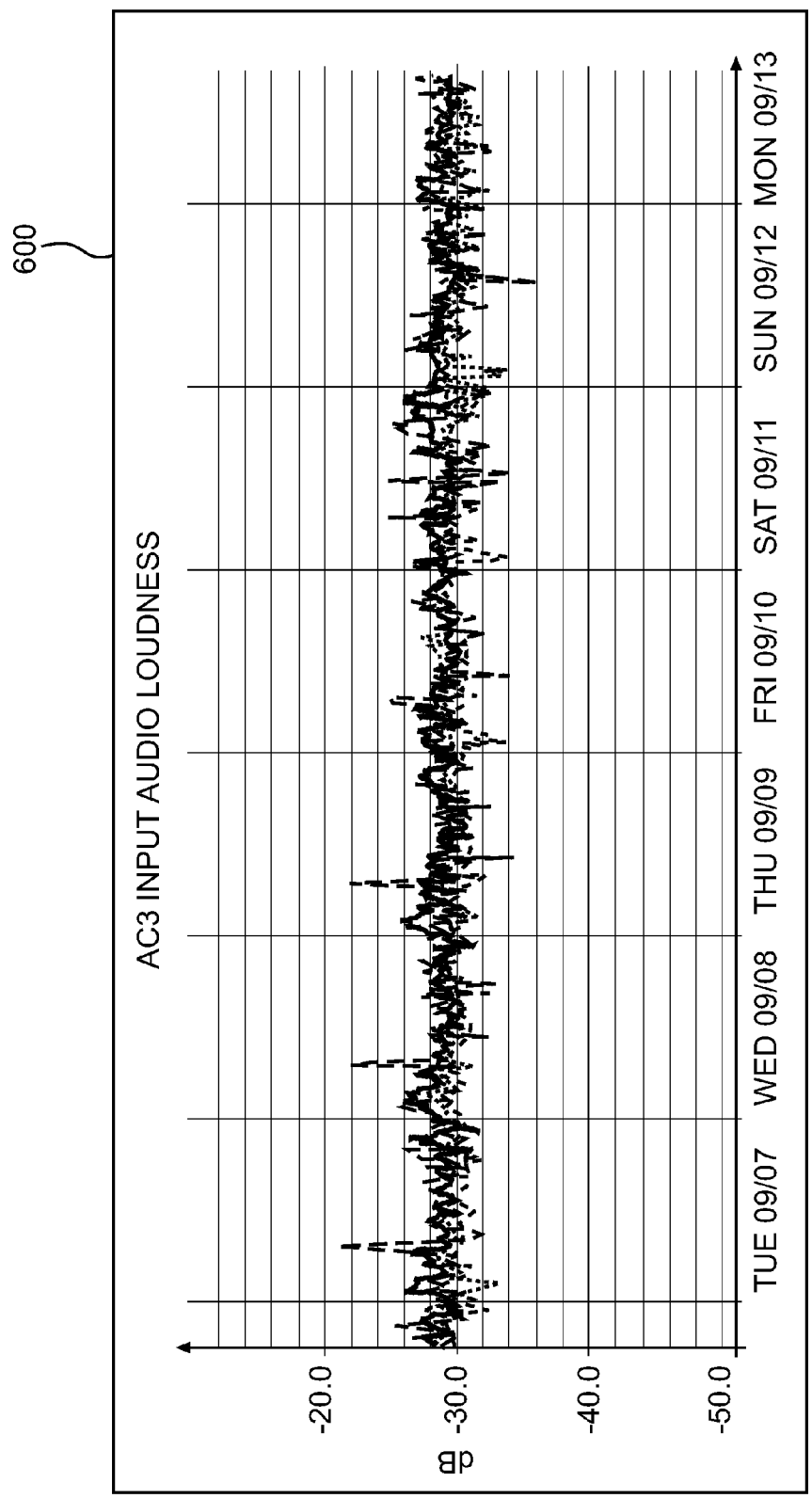
FIG. 6a is an exemplary graphical representation of exemplary audio loudness data for AC-3 input to the TPS for processing that can be displayed to a user according to an embodiment of the present invention.

FIG. 6a is an exemplary graphical representation 600 of exemplary audio loudness data for AC-3 input to the TPS for processing that can be displayed to a user according to an embodiment. In graphical representation 600, the exemplary audio loudness data was collected at 5-second intervals for 5 channels of audio loudness data. In an embodiment, there are fewer channels as the channels carry HD television signals. As can be seen, graphical representation 600 allows users to view the audio data over time. In the exemplary data set of FIG. 6a, the data collection period was a week. Any desired view period can be selected by a user, including, for example, a day, a part of a day, a week, several weeks, or other time frame. In an embodiment, different colors are used to represent the different channels. In an embodiment, a user can select one or more of the channels for viewing in separate screen on in an overlay screen by clicking on the one or more channel. As described above, a user can perform various operations on one or more of the channels prior to viewing.

Figure 7A:
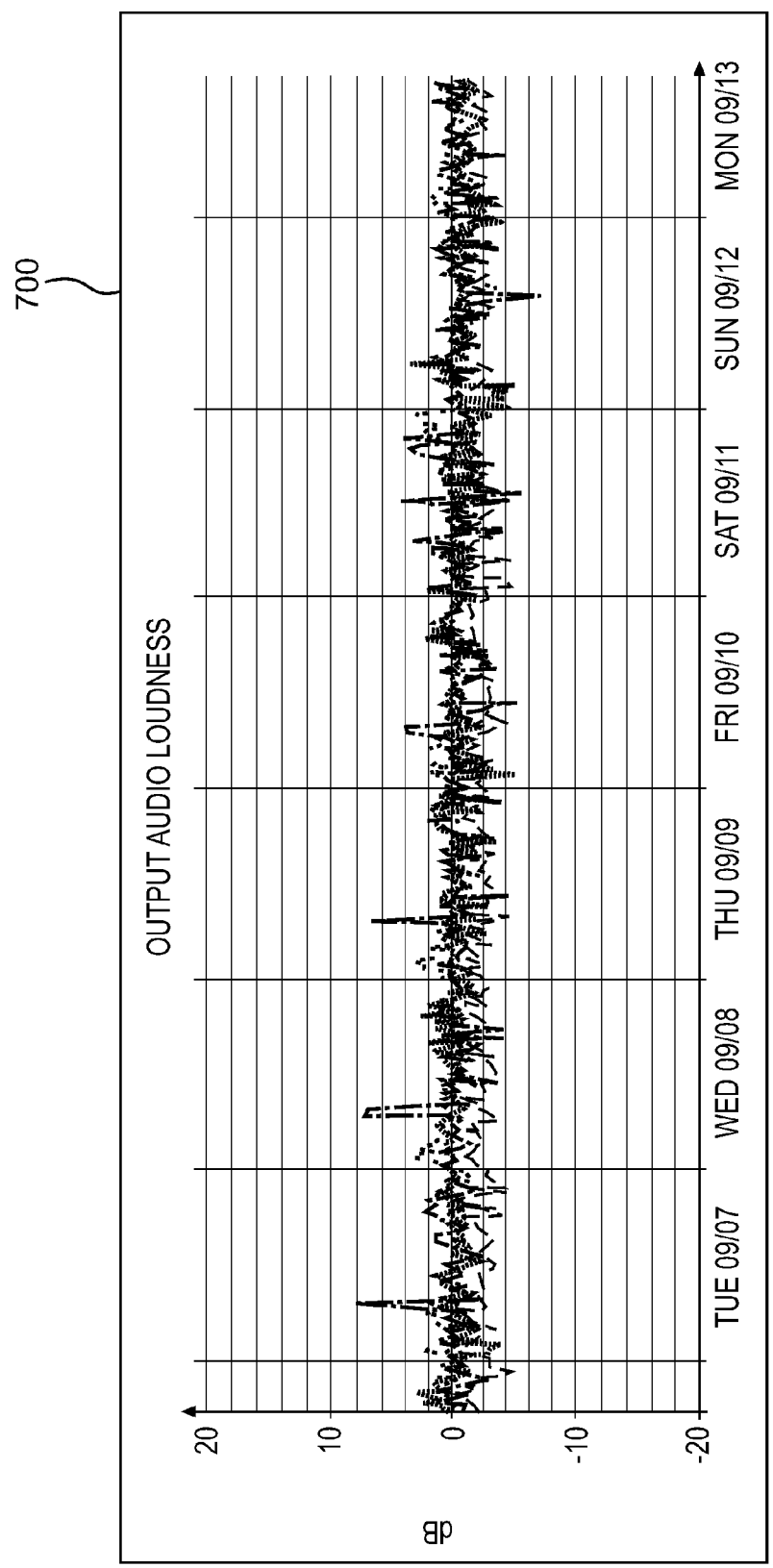
FIG. 7a is a graphical representation of exemplary audio loudness data for AC-3 audio output after processing by TPS for broadcast at 5 second intervals for 8 channels of audio loudness data according to an embodiment of the present invention.

In an embodiment, the data representative of the input is derived from the output data (as shown, for example, in FIG. 7a). For example, to determine the input data corresponding to output data, the offsets applied by TPS to derive the output data are removed. Thus, to derive input audio data for AC-3 audio (as shown for example in FIG. 6a), starting with the output audio data for AC-3 audio (as shown for example in FIG. 7a), the −28 dB normalization offset is removed. In addition, any gain offset applied is removed. In an embodiment, the gain offset can be gain applied to make an average loudness equal to a target and/or any gain applied by an audio loudness AGC (described below). The resulting value is the input audio loudness data value. In an embodiment, the conversion from output data to input data is performed by TPSMON from output data provided by the TPS.

FIG. 6b illustrates an exemplary table 620 corresponding to the data shown in exemplary graphical representation 600 according to an embodiment. In exemplary table 620, the PID is the channel ID for the particular a particular data stream. Table 620 illustrates average audio loudness for the week and for each day making up the weekly average. In an embodiment, dialnorm is also included in table 620. As described above, a user can perform various operations on one or more of the channels prior to viewing.

Dialnorm (dialog normalization or volume normalization) is a part of the AC-3 coding. In an embodiment, dialnorm provides a mechanism for adjusting loudness of an AC-3 audio stream. For example, a change of 1 LKFS in dialnorm corresponds to a change of 1 dB in audio loudness. In an embodiment, dialnorm can be adjusted by changing the value of dialnorm in the BSI information in the AC-3 audio data header as described above with respect to FIG. 3.

Dialnorm is useful to display for the AC-3 audio stream because it can change at a source provider. Knowledge of how dialnorm changes over time can be useful in correcting loudness problems. For example, a service provider may be able to contact a source provider to advise them that certain of their operations are causing changes to dialnorm, and therefore loudness issues. In addition, dialnorm issues can arise when an affiliate switches to network programming. If the affiliate dialnorm is set to a value different than the network, loudness issues will likely arise. Using a tool that having the ability to provide historic dialnorm allows a provider to see recurring disparities in dialnorm that may be associated with switches such programming switches. In those cases, the service provider can advise the affiliate of the issue and request they change their dialnorm value to compensate for it.

In an embodiment, loudness and dialnorm can be illustrated side-by-side to maintain compatibility with the familiar display of these values on an LM 100. In such an embodiment, because dialnorm is not applied in the value provided by the LM 100, the data displayed in table 620 for loudness in the weekly average is loudness without dialnorm applied. To determine the actual loudness, the following equation is used:

Actual loudness=loudness value in table 620−(31+dialnorm value). In an embodiment, the values of audio loudness represented in graphical presentation 600, however, are displayed with dialnorm applied using the above equation. This reduces the complexity associated with visualizing audio loudness data with dialnorm applied from audio loudness data without dialnorm applied.

Further, in an embodiment, variations in dialnorm during an averaging period are noted using the term "VAR" as shown in table 620. Although dialnorm is generally constant during a day or a week, its value can change. Identifying such changes with the term "VAR" makes the presence of such dialnorm changes more apparent. Users can then review the dialnorm for the particular channel to determine if there is an audio loudness issue that needs to be addressed.

In another embodiment, variable dialnorm is detected by invalid values of dialnorm. For example, in an embodiment, dialnorm must be an integer. Thus, the average dialnorm should be an integer if the dialnorm does not vary. As a result, a dialnorm value with a fractional component indicates variation in the value of dialnorm.

In an embodiment the audio loudness and dialnorm values in table 620 are color coded to indicate how they compare one another. This is because in an embodiment, the target loudness for table 620 is where loudness without dialnorm applied is equal to dialnorm. This results from the equation above where if the loudness without dialnorm applied equals dialnorm, the target loudness is −31 dB with dialnorm applied. Therefore, in an exemplary embodiment, the average audio loudness is shown in black (no color change) if the difference between the average audio loudness and dialnorm is less than 3.0 db. If the difference between the average audio loudness and dialnorm is greater or equal to 3.0 db, but less than 6.0 dB, the average audio loudness is displayed in yellow. If the difference between the average audio loudness and dialnorm is greater or equal to 6.0 dB, the average audio loudness is displayed in red. In an embodiment, dialnorm is color coded with respect to target dialnorm in an analogous manner as audio loudness with respect to target audio loudness. The ranges, number of ranges, and colors can be changed as desired for a particular implementation and may be different for audio loudness and dialnorm.

Using the audio loudness and dialnorm color schemes emphasizes where audio loudness problems may be occurring. For example, weekly or daily averages of greater or equal to 6.0 dB differences between average audio loudness and target audio loudness will stand out much more clearly in red in an embodiment of the present invention. For example, it is often the case that dialnorm will change significantly when an affiliate changes from its programming to network programming. Note, there is generally a corresponding change in the loudness data as well.

Figure 6C:
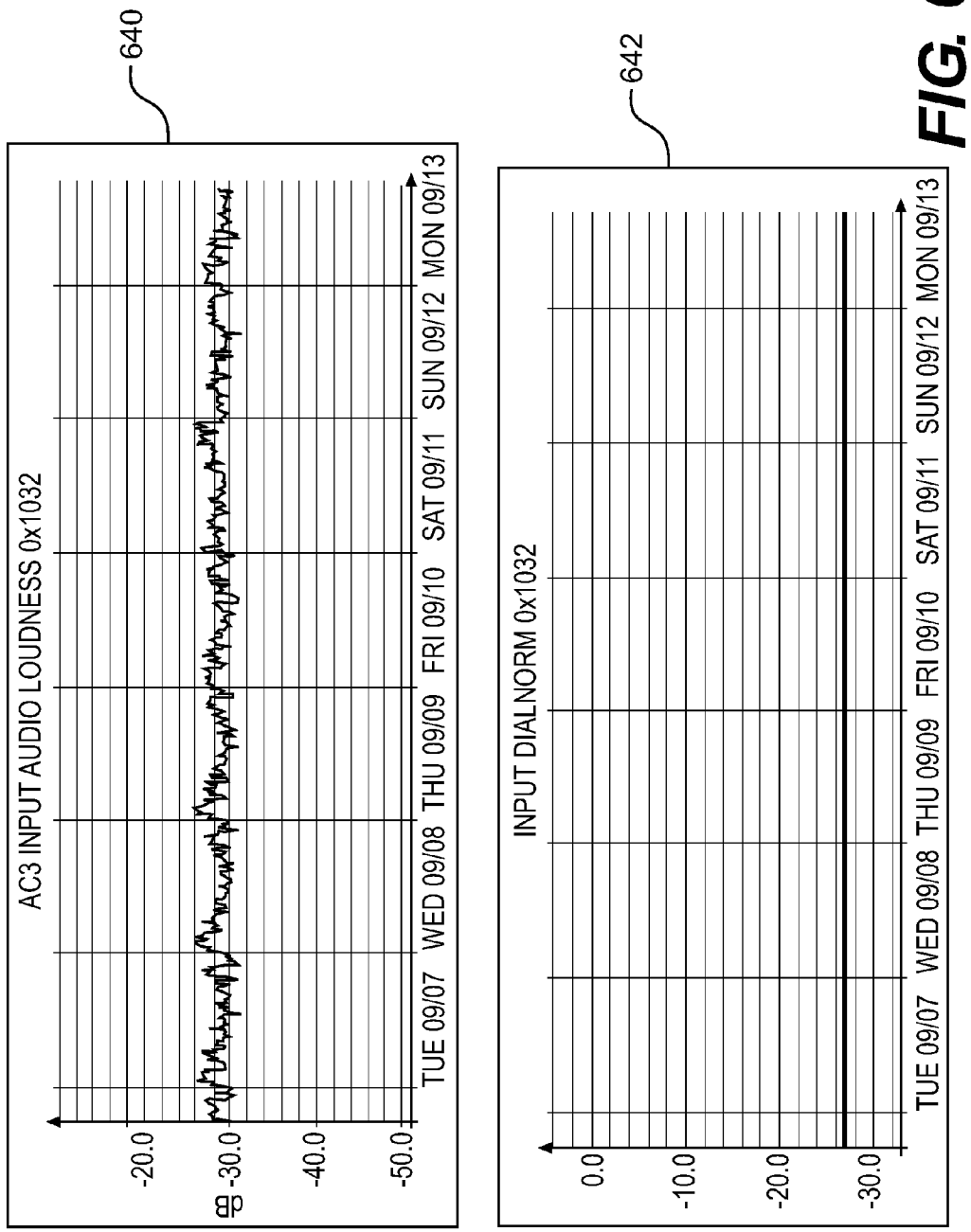
FIG. 6c is an exemplary graphical representation of a single channel and its associated dialnorm as input to the TPS for processing collected over a given period according to an embodiment of the present invention.

FIG. 6c is an exemplary graphical representation 640 of a single channel and its associated dialnorm 642 as input to the TPS for processing collected over a given period according to an embodiment. For example, the channel illustrated in graphical representation 640 is identified as PID 0×1032. Viewing the dialnorm in this manner can help a user determine where dialnorm deviations may indicate audio loudness problems.

FIG. 7a is a graphical representation 700 of exemplary audio loudness data for AC-3 audio output after processing by TPS for broadcast at 5 second intervals for 8 channels of audio loudness data according to an embodiment. In the exemplary graphical representation, the displayed data has been offset by a normalization amount of −28 dB. Although −31 dB is the amount described by the ATSC recommended practice guide, A/85, and can be used, in an embodiment, −28 dB is used in an embodiment for normalization offset because some customers may have receiving equipment with gains that are too weak to allow for sufficient volume increase to effectively hear the audio if a normalization offset of −31 dB is used. As can be seen, using audio loudness monitoring allows users to view the audio data over time. In the exemplary data set of FIG. 7a, the data collection period was a week. Any desired view period can be selected by a user, including, for example, a day, a part of a day, a week, several weeks, or other time frame. In an embodiment, different colors are used to represent the different channels. In an embodiment, a user can select one or more of the channels for viewing in separate screen on in an overlay screen by clicking on the one or more channels. As described above, a user can perform various operations on one or more of the channels prior to viewing.

FIG. 7b illustrates a table 720 corresponding to the data shown in graphical representation 700 according to an embodiment. In exemplary table 720, the PID is the channel ID for the particular a particular data stream. Exemplary table 720 illustrates average audio loudness for the week and each day making up the weekly average. In an embodiment, dialnorm is also included in table 720.

Figure 7C:
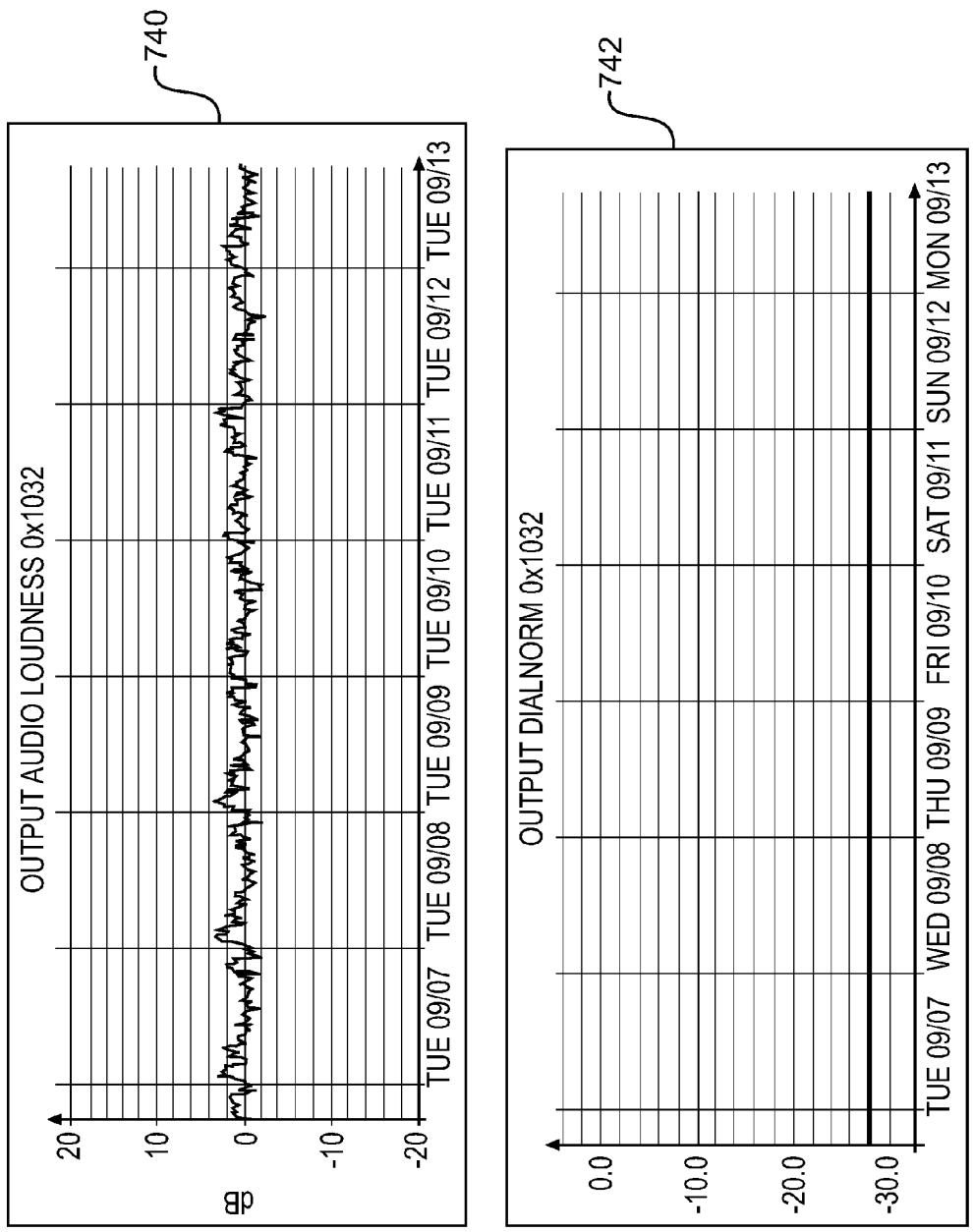
FIG. 7c is an exemplary graphical representation 740 of a single channel and its associated dialnorm 742 as output by the TPS for broadcast according to an embodiment of the present invention.

FIG. 7c is an exemplary graphical representation 740 of a single channel and its associated dialnorm 742 as output by the TPS for broadcast according to an embodiment. For example, the channel illustrated in graphical representation 740 is identified as PID 0×1032. Viewing the dialnorm in this manner can help a user determine where dialnorm deviations may indicate audio loudness problems in TPS processing to generate the output audio for broadcast. Note that in the output, the audio AGC (described below) increased the audio by 1 dB.

Any of the above-described graphical and tabular representations of collected data can be displayed in a single display in an embodiment. For example, as illustrated in FIG. 8, a display 802 may include graphical representation 400 and table 420 in a single display.

Figure 8:
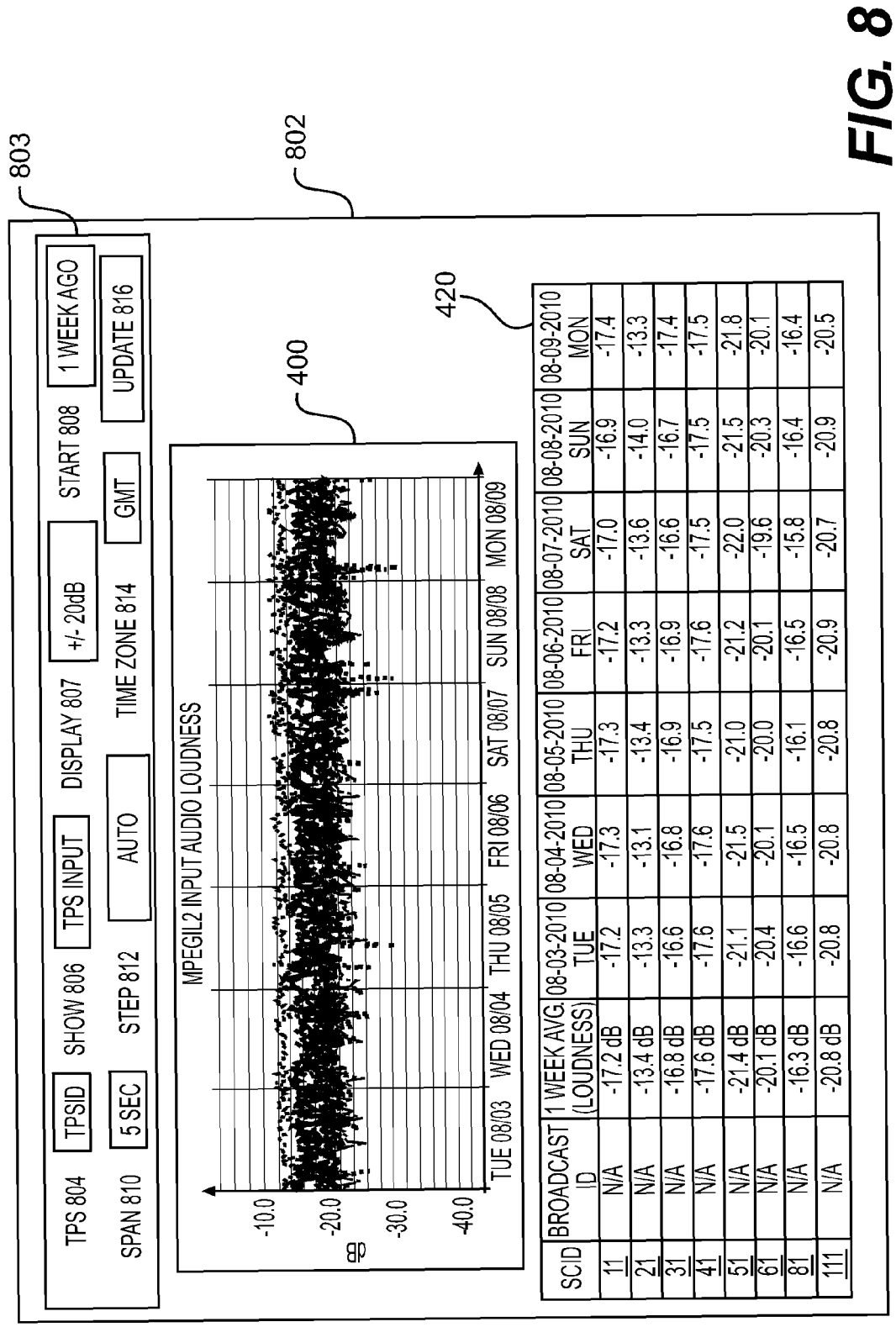
FIG. 8 illustrates a graphical representation of audio loudness data and a user interface according to am embodiment of the present invention.

In addition, FIG. 8 includes an exemplary user interface 803 that can be implemented according to an embodiment. Exemplary user interface 803 includes a TPS selection button 804. In an embodiment, TPS selection button 804 selects the particular TPS for which to obtain data to display in display 802. In the example of FIG. 8, the user has selected the TPS identified by "TPSID". In an embodiment, data from more than one TPS can be selected for processing and/or display. In an embodiment, any one or more available channels for the selected TPS or TPSs can be selected for processing and/or display. For example, in an embodiment, one or more channels can be selected by clicking on the desired SCIDs in table 420. In another embodiment, a channel selection button can be included in user interface 803 to select a particular one or more channels. In an embodiment, all channels in a selected TPS are selected by default. According to an embodiment, available channels are channels available in a particular transport being processed.

User interface 803 includes a show button 806. Show button 806 is used to select which data set a user desires. For example, in an embodiment, a user can select the TPS input data to be processed or TPS output data for broadcast. As described above, in an embodiment, the TPS input data is derived from the processed TPS output data. In another embodiment, TPS input and output data can be overlaid in a single graphical representation.

User interface 803 includes a display button 807. Display button 807 is used to select the scale to display the data in graphical representation 400. In an embodiment for example, the data can be displayed on a +/−20 dB scale or a +/−10 dB scale, where the default scale is the +/−20 dB scale. Other scales can be used as appropriate in other embodiments.

User interface 803 includes a start button 808. Start button 808 is used to select a start time for display of the data. For example, in an embodiment, the start value can be 1 hour ago, 4 hours ago, 1 day ago, 1 month ago, 4 months ago, or virtually any other desired value. In an embodiment, the default value is "1 week ago."

For example, as shown in exemplary display 803, the start time is selected as "1 week ago." This is a relative selection to select data to display start from one week prior to the time the display is presented or updated. In an embodiment, any desired historical start time can be selected. In addition to relative times, absolute times can be selected as well. For example, to begin data display using data collected beginning on Aug. 3, 2010, a user can select "1 week ago" on Aug. 9, 2010 or select "Aug. 3, 2010" as the value for start button 808. In an embodiment, time is measured according to date irrespective of the time on a particular day. In another embodiment, time is measured based on the actual time the display is presented or updated. In the latter case for example, if the display is presented at 2 pm on Aug. 9, 2010 using data from "1 week ago," the data displayed will begin with the data point at 2 pm on Aug. 3, 2010.

Exemplary user interface 803 includes a span button 810. Span button 810 is used to select the interval of the collected data to display beginning at the start time. That is, span is the duration after the start time for the data selected. In an embodiment, the span can range from 30s to 4 months. Other span ranges can be selected as appropriate for a particular embodiment.

In an embodiment, the span default is "Auto." Auto means that all data for from the start time will be displayed. For example, in exemplary user display 802, data collected at 5 second intervals beginning at the start time is selected. In an embodiment, the data point to use to begin display is determined based on the start time and data sampling interval. For example, using a data sampling interval of 5 seconds and start time of one week ago, the system will begin with the data point that is 120960 data points prior to the most recently collected data point (7 day/wk*24 hr/day*3600 s/hr/5), and display every collected point from that time. In another embodiment, in which data is collected every second, the system would begin with the data point that is 640800 data points prior to the most recently collected data point.

Exemplary user interface 803 includes a step button 812. Step button 812 is used to select the interval of the collected data to display beginning at the start between selected data points. For example, in exemplary user display 802, can be set to 5 seconds or 1 day. In an embodiment where the minimum collection interval is 5 seconds, a step of 5 seconds indicates every data point.

In an embodiment, any step interval larger than the data sampling interval will result in data averages being displayed rather than raw data. For example, in an embodiment having a data sampling interval of 5 seconds, any step size greater than 5 seconds will result in data averaged over the selected step. For example, if a 1-hour step is selected, the data sampled at 5-second intervals will be averaged over an hour for display.

Exemplary user interface 803 includes a time zone button 814. Time zone button 814 is used to select the time zone in which the data is to be displayed. In an embodiment, this can be useful for synchronizing data that is collected from different time zones, for example, data collected from different parts of the United States or data collected internationally.

Exemplary user interface 803 includes an update button 816. Update button 816 is used to redisplay data according to newly selected parameters as defined, for example, according to the exemplary embodiment just described. In an embodiment, table 420 is displayed using GMT. In other embodiments, the time zone for table 420 can be selected by the user.

It should be noted that user interface 803 is exemplary. Other types of information and buttons corresponding thereto may be provided for a particular implementation within the scope and spirit of the present invention. For example, mathematical functions, including averages, filters, transforms, and other mathematical functions may be made available to users to process the data selected for display. In addition, mathematical functions that process more than one channel can be included. Such functions include, for example, functions to add, subtract, calculate a dot product, and calculate a vector product of multiple channels.

As can be seen in FIGS. 4a-b, 5a-b, 6a-b, and 7a-b, embodiments of the present invention not only record historical audio loudness data, but also allow a user to graphically and tabularly display that data in a flexible manner to suit the user's needs. These presentations assist users to easily identify potential audio loudness trouble areas and take steps to remedy any issues.

As described above, in an embodiment data stored by the TPS is accessed via a TPS monitor application from remote browsers, such as for example, browsers executing on computers 115a and 115b in FIG. 1. Computers 115a and 115b can be any computer configured to access the TPS-MON and display returned data. For example, in an embodiment, the TPS monitor is an application configured to access the TPS using the TELNET protocol and display received data on an associated monitor. Exemplary TELNET commands are STATUS LOUDNESS and STATUS AUDIO to obtain data collected by the TPS. For example, in an embodiment, the TPS stores 5 minutes of data in a running window for each channel in a transport. In such an embodiment, the snapshot includes the last 5 minutes of data collected by the TPS for each channel in a transport. In another embodiment, a portion of the stored data is periodically collected by the TPS. For example, in an embodiment, a 2- or 3-minute portion of the stored data is collected. In an embodiment, data stored by the TPS can be accessed using a TPS monitor executing on a computer co-located with the TPSs.

In an embodiment, the data collected by the TPS monitors is stored in a file accessible by a TPS monitoring application, such as TPSMON. For example, the data can be stored in RAM, internal hard drive, external hard drive, or any other storage medium that can store the data and be access by the TPS monitoring application.

Figure 9A:
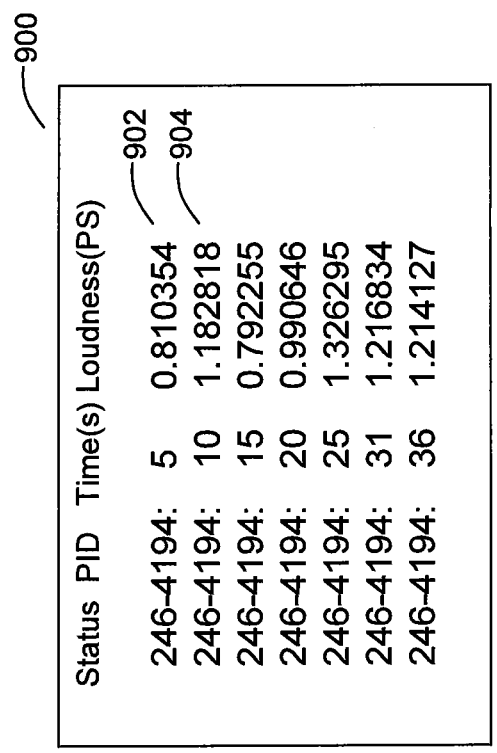
FIG. 9a illustrates an exemplary file structure used to store data returned by a TPS in response to a STATUS LOUDNESS command for AC-3 audio data according to an embodiment of the present invention.

FIG. 9a illustrates an exemplary file structure 900 used to store data returned by a TPS in response to a STATUS LOUDNESS command for AC-3 audio data according to an embodiment. In FIG. 9a, the stored data corresponds to data samples collected for a particular channel. The stored data samples are illustrated by the several lines in the FIG. 9a. For example, line 902 corresponds to a first data sample; line 904 corresponds to a second data sample and so on. For clarity, only lines 902 and 904 are labeled. The remaining lines correspond to data returned for separate data samples. In an embodiment, MPEG-1, layer II data is stored using a similar format.

In an embodiment, the data stored for each sample is as follows: a status message (in the example, 246), the channel PID in decimal (equivalent to 0×1062), time (in seconds) from the collection initiation, and loudness in Power-Seconds. To convert from Power-Seconds to dB, the log of the Power-Seconds value is calculated and multiplied by 10. For example, 0.810354 Power-Seconds equals −0.91 dB.

In an embodiment, the TPS returns 5 minutes of data for each channel in a transponder and returns this stored data in response to the STATUS LOUDNESS command. The returned data is stored by the TPS monitoring system in a file having a structure such as illustrated in FIG. 9a. For example, in an embodiment, the TPS monitoring system stores the returned data in a file corresponding to each channel in the transponder.

Thus, in an embodiment, data for each separate channel in a transponder processed by a TPS can be collected and stored by the TPS monitoring system in a tabular format such as illustrated, for example, by table 900. This stored data can be subsequently processed and/or displayed to a user as described above.

As explained in above, in an embodiment, TPS monitoring applications access and obtain the most recent data stored by the TPS. In an embodiment, for example, the data is accessed by the TPS monitoring applications from the TPS every 2 to 3 minutes. Having a larger buffer in the TPS than the TPS monitoring station collection interval allows the collection interval to be adjusted as well as provides a repetition of data to use as a check to reduce the likelihood of missed or corrupted data. In an embodiment, the data obtained by the TPS monitoring system is appended to previously stored data for each channel, thereby preserving the historical collections of the data.

In another embodiment, the TPSMON application is configured to obtain and store a portion of the data stored by the TPS. For example, in an embodiment, the TPSMON is configured to collect a 2- or 3-minute portion of the stored data every minute. The portion of the data and periodic collection period can be predetermined or user-selected. In such an embodiment, the STATUS LOUDNESS command can have a time parameter. In an embodiment, the time parameter indicates the amount of stored data the TPSMON application should obtain. For example, in executing the command STATUS LOUDNESS 120 causes the TPSMON application to collect 2 minutes of data. In an embodiment, the TPSMON application executes a STATUS LOUDNESS 120 or STATUS LOUDNESS 180 command every minute to collect a portion of the data stored by the TPS. As described above, the collected data is compared to determine any overlap so that only new data acquired from the TPS is stored by the TPSMON application.

A consideration in the TPS station monitoring collection interval is the impact collection request can have on the data amounts being transferred over the network and resulting network traffic issues. For example, if a site has a number of TPSs, frequent requests from the TPS monitoring station for all the requested data can overload the data carrying capacity of the network and significantly reduce network efficiency and speed. Not only can the network be overloaded, but the TPS must devote resources for performing what may be non-essential tasks rather than its critical tasks, such as translation and the like. To avoid this issue, in an embodiment, a longer TPS monitoring station interval is used in facilities having more TPSs. For example, TPS monitoring stations may request collected TPS data every 3 minutes in facilities having more TPSs and every 2 minutes in facilities having fewer TPSs. In another embodiment, every minute STATUS LOUDNESS 180 is executed by TPSMON applications in facilities having more TPSs and STATUS LOUDNESS 120 is executed in TPSMON applications in facilities having fewer TPSs. In an embodiment, this helps reduce the traffic load on the system.

FIG. 9b illustrates an exemplary file structure 920 used to store data returned by a TPS in response to a STATUS AUDIO command for AC-3 audio data according to an embodiment. In FIG. 9b, the stored data corresponds to a data sample collected for a particular channel. As shown in FIG. 9b, in an embodiment, the file format is as follows: a status message (in the example, 247), the channel PID in decimal (equivalent to 0×1062), time (in seconds) from the collection initiation, loudness in dB, loudness in Power-Seconds, gain offset applied by the TPS, audio bit rate in bits per second (bps), dialnorm in dB as the TPS receives it, and dialnorm out in dB as the TPS broadcasts it. The TPS monitoring system stores the data returned in response to the STATUS AUDIO command when the data is received.

The STATUS AUDIO command can be executed at any interval. For example, in an embodiment, the TPS monitoring system sends the STATUS AUDIO command every minute. Shorter intervals can be used, for example, to study how dialnorm changes in shorter intervals, for example, during advertising times.

In an embodiment, only the gain offset, audio bitrate, dialnorm in, and dialnorm out information is reported to the user. In such an embodiment, the loudness information is obtained using the STATUS LOUDNESS command described above.

In an embodiment, the TPS is configures to perform audio loudness control by analyzing data stored for a period. For example, in an embodiment, an audio automatic gain control (AGC) function can be implemented using the stored data. In an embodiment, the audio AGC is used to establish a loudness baseline for all the channels. Although audio loudness for channels can vary throughout a day depending on content, an audio AGC can be used to establish an overall loudness baseline for all channels. By placing all channels at the same loudness baseline, subscribers will not be forced to adjust volume as much when switching between channels.

In an embodiment, AGC essentially operates on long term averages of audio data for a channel. For example, in an embodiment, AGC analyzes up to 4 days of audio data for a particular channel to determine whether and what adjustment may be required to bring an average loudness baseline to a target loudness baseline. In an embodiment, the target loudness baseline is as suggested in the ATSC A/85 recommendation of −31 dB for AC-3 audio or −24 dB for MPEG-1, layer II audio. In other embodiments, the target loudness baselines can be different. For example, in an embodiment, −26 dB for MPEG-1 layer II audio data and −28 dB for AC-3 audio data. One reason for deviating from the recommended concerns dialnorm limits. For example, in an embodiment, dialnorm is limited to values of −31 dB to −1 dB where loudness increases with decreasing dialnorm value. In some cases, however, the baseline dialnorm value may be too close to −31 dB to allow significant adjustment to dialnorm. As a result, lowering the loudness baseline may provide additional room for AGC dialnorm adjustment. Although, the baselines of −26 dB for MPEG-1, layer II audio data and −28 dB for AC-3 audio data differ, the 2 dB difference is likely to be negligible to most subscribers.

More or less data than 4 days of data can be analyzed for the AGC function. However, the time frame should be long enough such that intended changes in program loudness, such as for example, an explosion, loudness variation for artistic effect in musical compositions and other situations, voice loudness changes such as whispering or yelling for dramatic effect, and other intended loudness changes are preserved.

To perform the AGC function, in an embodiment, the TPS samples the audio data. For example, as described above, in an embodiment, the audio data for each channel is sampled every 5 seconds. In alternate embodiments, any sampling interval, including non-periodic sampling intervals can be used.

The collected samples are then averaged over a time period. For example, in an embodiment, the samples for each channel are averaged every hour. In an embodiment, the collected samples to be used in the AGC averaging process are stored in a memory in the TPS. The minute used for calculating the hourly average is based on the time the TPS software is started. For example, if the TPS is started at 8:43, the average will be taken in the $43^{rd}$ minute of the hour for data collected the prior hour.

The data averages are stored in a separate file for each channel processed by the TPS. In an embodiment, up to 4 days of the averaged data is stored. In the exemplary embodiment, 720 samples per channel are averaged in the hourly average (12 samples per minute for 60 minutes). Any averaging time that encompasses at least two samples, including non-periodic averaging times, can be used. The averages for each channel are then averaged over a second time period. In an embodiment, for example, the second time period is initially 4 hours, and can extend to up to 4 days as AGC operation progresses.

In an embodiment, AGC loudness adjustments can only be made during a maintenance window. According to an embodiment, the maintenance window is a time frame during which maintenance to a broadcast system is performed. The time frame is chosen when there are likely to be few subscribers using the system. In an embodiment, for example the maintenance window extends from 11 pm to 5 am, depending on time zone.

Further, in an embodiment, AGC adjustment is permitted only at a certain time within the maintenance window. For example, in an embodiment, the particular time of AGC update occurs in the hour from 8 am GMT to 9 am GMT. This time period, during daylight savings time, corresponds to 4 am to 5 am on the East Coast and 1 am to 2 am on the West Coast. Because GMT does not follow daylight savings time, during non-daylight savings time, these periods occur an hour earlier. Moreover, in an embodiment, AGC adjustments are made during a particular minute in the maintenance window. The minute used for calculating the adjustment in the maintenance window is based on the time the TPS software is started. For example, if the TPS is started at 8:43, the adjustment will be made in the $43^{rd}$ minute of the hour beginning at 8 am GMT, i.e., at 8:43 GMT.

In an embodiment, to normalize audio to a particular baseline, audio data in a particular channel is monitored. For example, audio data in a particular channel as derived according to the ITU-R BS. 1770 standard is stored. A target loudness baseline is chosen. For example, in the case of AC-3 audio the target loudness baseline is chosen at −28 dB. For MPEG-1, layer II audio, the target loudness baseline is chosen at −26 dB. Other values for target loudness baseline be chosen for particular implementations. In an embodiment, the target loudness baseline is normalized to 0 dB by offsetting the target level baseline as required for MPEG-1, layer II audio data and AC-3 audio data. That is, the MPEG-1, layer II audio loudness baseline is offset by −26 dB and the AC-3 audio loudness baseline is offset by −28 dB. Therefore in an embodiment, the effective target baseline for both MPEG-1, layer II audio data and AC-3 audio data is 0 dB. In an embodiment, AGC functionality attempts to adjust input audio data for a channel to generate output audio data for the channel having the desired target loudness (by obtaining the normalized loudness of 0 dB). After the data has been normalized, an audio AGC process is initiated to bring the audio loudness of the channel to the target loudness and maintain it there.

In an embodiment, the audio AGC is configured according to certain constraints. At startup, MPEG-1, layer II audio is offset by an amount. The amount is based on the inherent 7 dB difference in target loudness between MPEG-1, layer II audio (target −24 dB) and AC-3 audio (−31 dB) according to the ATSC A/85. For example, in an embodiment, the offset is −6 dB (i.e., MPEG-1, layer II audio attenuated by 6 dB). Other values for offset, such as −8 dB, −7 dB, or other value may be used in a particular implementation.

In an embodiment, adjustments for MPEG-1, layer audio are limited to 2 dB increments. As a result, while 7 dB attenuation may be preferred, the 2 dB increment limitation requires attenuation of either 6 or 8 dB. In an embodiment, AC-3 adjustments can be in 1 dB increments.

In another embodiment, there are no default attenuation for MPEG-1, layer II. This is because the input target loudnesses of −24 dB is close enough to the output target loudness of −26 dB that the offset is not required.

In an embodiment, a minimum amount of data must be stored prior to calculating and applying an AGC offset to move target loudness to 0 dB. Any time frame can be used that provides a reasonable AGC function. For example, in an embodiment, 4 hours of valid data are required prior to calculating and applying an AGC offset. In another embodiment, 12 hours are required. Thus, in the case where 4 hours of data are required, two conditions must be met for an AGC adjustment. First, at least 4 hours of valid audio level data must be available when the average is calculated. Second, the time must be the appropriate time within the maintenance window for adjustment as explained above.

After the AGC function has a sufficient amount of data and has begun operation, data is averaged up to a particular time period. In an embodiment, for example, up to 4 days of data is included in the average. Thus, in an embodiment, at least 4 hours of data is required to begin AGC operation. Once begun, AGC operation can analyze up to 4 days of averaged data. In an embodiment using hourly averages, therefore, up to 96 averages are considered in each AGC iteration. In an embodiment, once 4 days of data (96 averages) has been collected, the oldest average is replaced with the newest average for each iteration.

In an embodiment, valid data requires actual audio data. For example, silence is not considered valid audio data. As a result, if the audio level is below a certain threshold, the data is deemed to be silent and discarded. For example, in an embodiment, if the audio sample level is below −40 dB, it is deemed silent and discarded for audio AGC purposes.

In an embodiment, gain adjustment is limited. This can help to prevent audio distortion that might arise with too extreme a gain adjustment. For MPEG-1, layer II, maximum gain adjustment in a particular AGC iteration is 6 dB, and maximum gain attenuation in a particular AGC iteration is −16 dB. The reason for the unequal gain and attenuation values stems from the RF Mode and ATSC A/85 recommended practice. Because audio data is typically too loud, a larger downward adjustment is allowed. In addition, there is no distortion of the audio when it is attenuated. However, when adding gain, there is a possibility of clipping. Limiting the gain more reduces the risk of such clipping.

For AC-3, in an embodiment, audio gain adjustment in a particular AGC iteration is limited to 6 dB and audio attenuation for a particular iteration is limited to −6 dB. Other maximum and minimum adjustments can be used according to a particular embodiment. Where these limits are insufficient to adjust audio for a particular source, the source channel provider can be asked to adjust loudness to fall within acceptable ranges.

Figure 10:
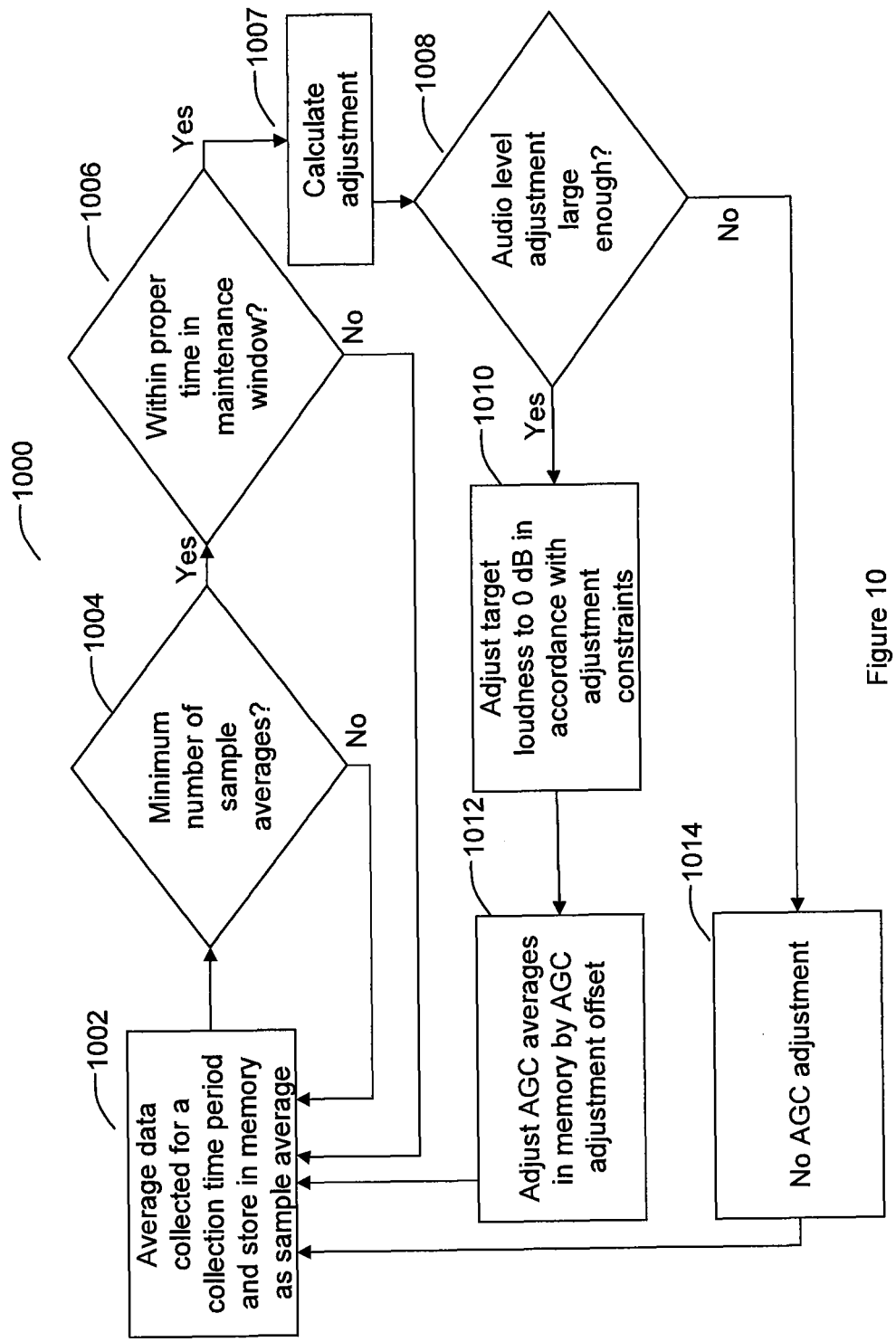
FIG. 10 is a flowchart for a method for audio automatic gain control to control audio loudness according to an embodiment of the present invention.

FIG. 10 is a flowchart for a method 1000 for audio automatic gain control to control audio loudness according to an embodiment. Method 1000 can be implemented in hardware, software, firmware, or any combination thereof. For example, in an embodiment, method 1000 is implemented in software controller in loudness data control module 121 in FIG. 1. In another embodiment, method 1000 is implemented in a hardware controller that operates in conjunction with loudness data control module 121. Other embodiments would be apparent to those skilled in the art.

Method 1000 begins in step 1002 where audio loudness data collected over a collection time period are averaged and the averages stored as a sample average. For example, in an embodiment, the collection time period is 1 hour. In embodiment, the data collected for the time period is stored in a memory associated with the TPS. In such an embodiment, data samples collected during the preceding hour are averaged to generate an hourly data sample. In step 1004, it is determined whether there are least a minimum number of sample averages required to initiate AGC operation. If there are not the minimum number of samples, the method continues in step 1002, where another sample average is calculated using data collected over the next collection time period. As described above, the number of required sample averages can vary as required for a particular implementation. For example, in an embodiment, 4 sample averages are required. In another embodiment, 12 sample averages may be required. If there are sufficient sample averages, the method continues in step 1006.

Once AGC operation has begun, sample averages are stored for up to a particular period. For example, in an embodiment, the particular period is 4 days, or 96 sample averages, where the averages are calculated hourly. In an embodiment, AGC operation considers sample averages for as much data as is stored up to the particular period. Thus, in an embodiment, where the particular period is 4 days, as many sample averages as are available up to 96 sample averages are considered for each AGC iteration.

In step 1006, it is determined whether the time at which the determination is being made is within the maintenance window, and particularly at the appropriate time within the maintenance window. If not, the method continues in step 1002, where another sample average is calculated using audio data collected over the next first time period. If the time at which the determination is being made is within the proper time in the maintenance window, the audio level adjustment is calculated in step 1007. In an embodiment, the audio level adjustment is calculated as the difference between the average of the sample averages and the target audio loudness.

Where the determined average is a non-integer, several methods may be used to determine the integer audio loudness level, including, for example, truncation, rounding up, rounding down, rounding toward 0, rounding toward the nearest step level, and dithering.

Figure 11A:
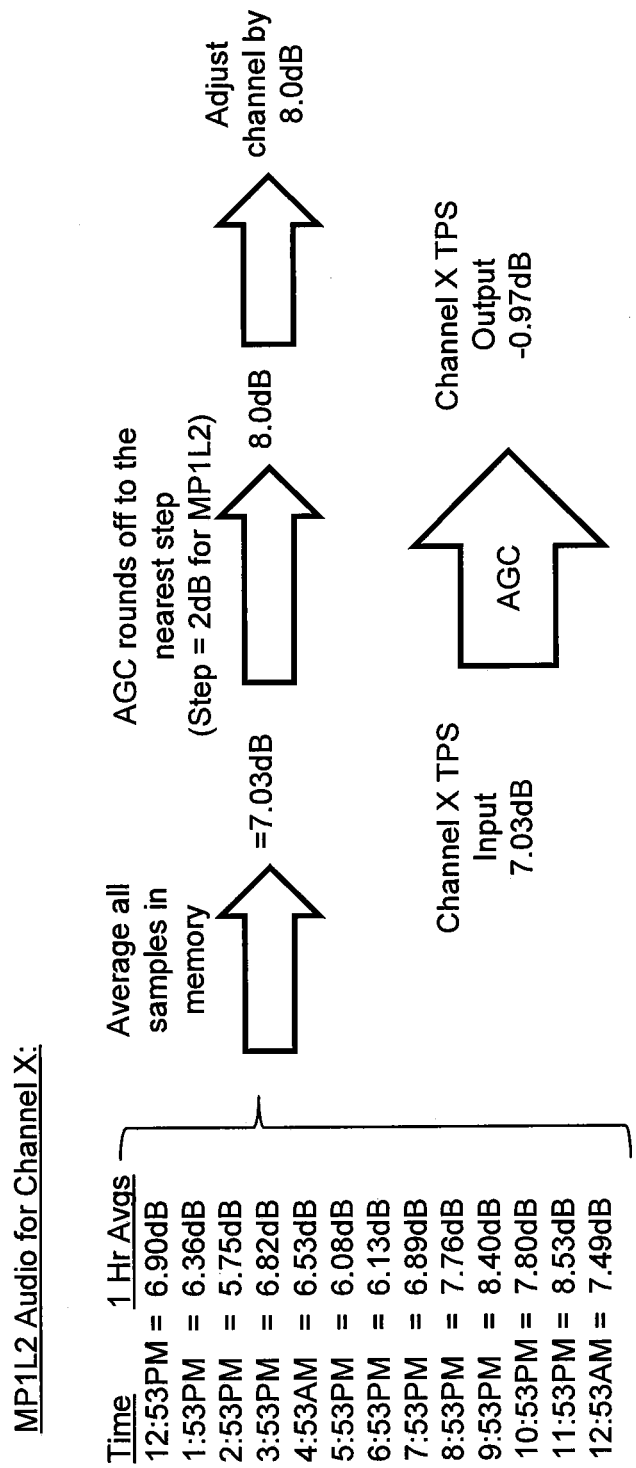
FIG. 11a illustrates an exemplary technique for generating a valid adjustment value for MPEG-1, layer II audio according to an embodiment of the present invention.
Figure 12:
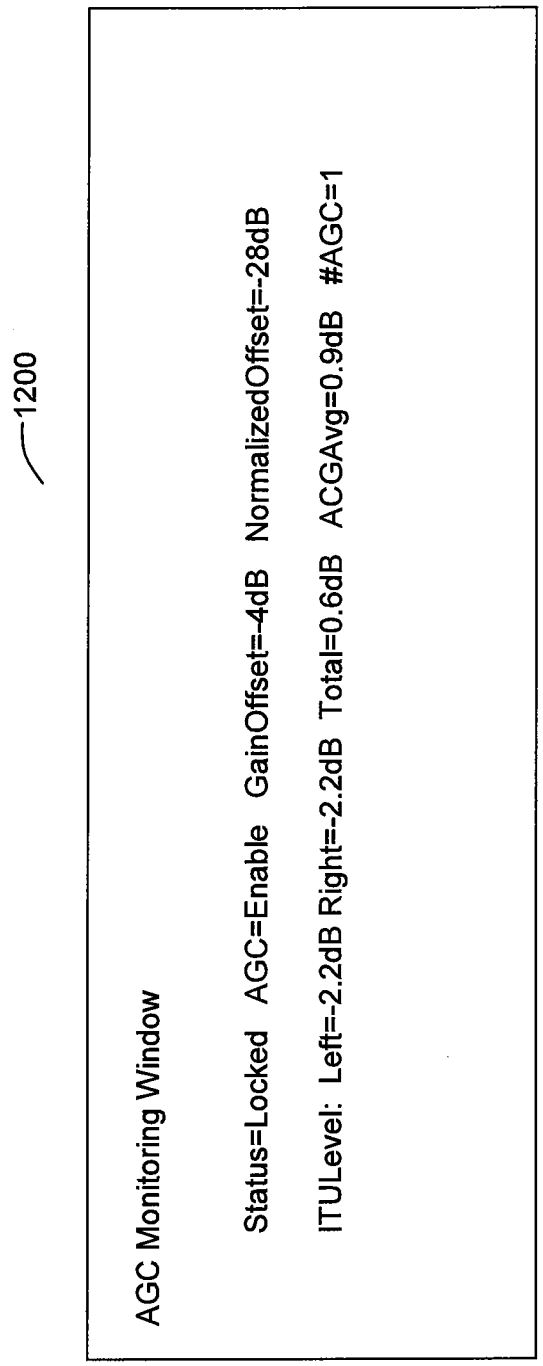
FIG. 12 illustrates an exemplary AGC status window according to an embodiment of the present invention.

FIG. 11*a* illustrates an exemplary technique for generating a valid adjustment value for MPEG-1, layer II audio according to an embodiment. In FIG. 11*a* there are 13 exemplary hourly data samples calculated by averaging the collected 5 second audio data samples each hour from 12:53 PM to 12:53 AM. In the example of FIG. 11*a*, 12:53 am is the appropriate time within the maintenance window to perform an AGC audio adjustment. In the example, of FIG. 11*a*, the audio data is normalized audio data. In an embodiment, for MPEG-1, layer II audio, the audio samples have been processed by subtracting −26 dB from each sample. The target audio loudness after normalization therefore is 0 dB.

In the example of FIG. 11*a*, the minimum adjustment for MPEG-1, layer II audio is 2 dB. The average of the 13 exemplary hourly data samples is 7.03 dB. Because this is not a valid adjustment, the value must be processed to determine a valid adjustment value. As has been described above, without limitation, a number of techniques to determine a valid adjustment step can be used. In the example of FIG. 11*a*, the determination of a valid adjustment step is performed by rounding the calculated adjustment to the nearest valid step. In this case, the nearest valid step is 8 dB. Because the target audio loudness is 0 dB, 7.03 dB indicates an average audio loudness is 7.03 dB above the target audio loudness. Thus, the AGC attenuates audio loudness by 8.0 dB to produce an output audio loudness of −0.97 dB. In an embodiment, all current samples stored in the TPS are attenuated by 8.0 dB.

The adjustment can be applied as the scale factor in the header associated with the MPEG-1, layer II audio data. For example, in an embodiment, metadata inserter 120 in FIG. 1 inserts the 8.0 dB in the header of the MPEG-1, layer II audio data.

Figure 11B:
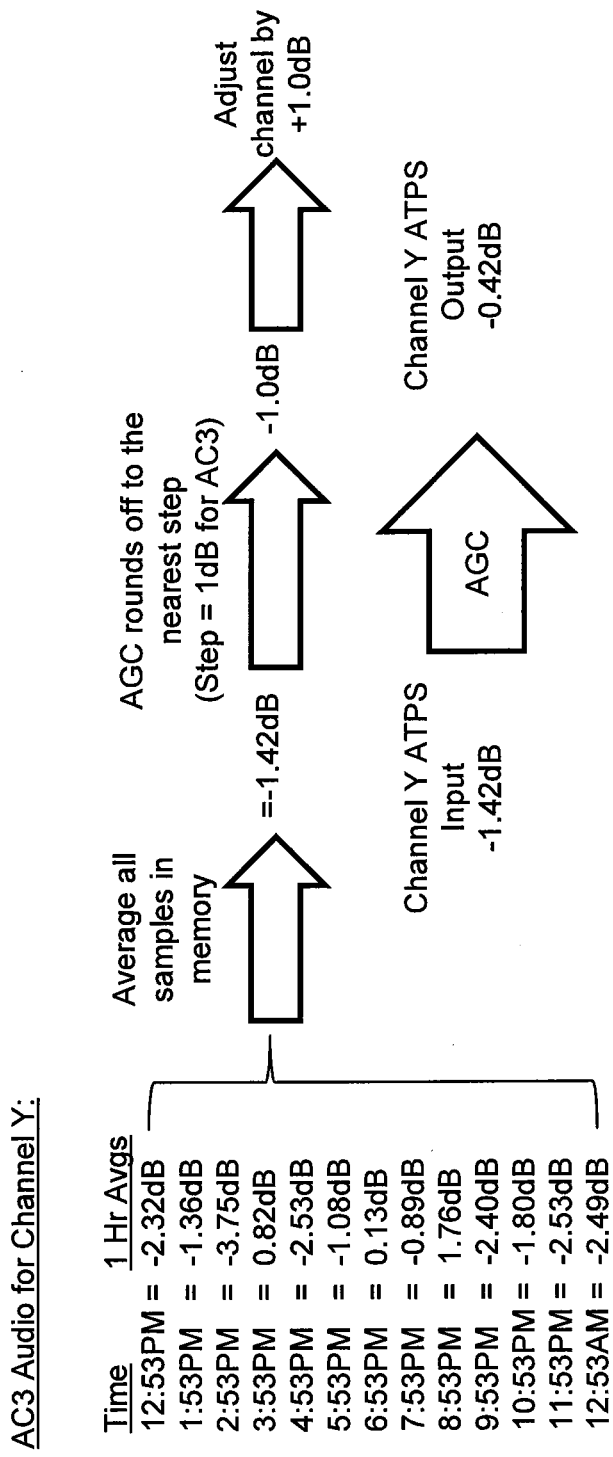
FIG. 11b illustrates an exemplary technique for generating a valid adjustment value for AC-3 audio according to an embodiment of the present invention.

FIG. 11*b* illustrates an exemplary technique for generating a valid adjustment value for AC-3 audio according to an embodiment. FIG. 11*b* shows 13 exemplary hourly data samples calculated by averaging the collected 5 second audio data samples each hour from 12:53 PM to 12:53 AM. In the example of FIG. 11*b*, 12:53 am is the appropriate time within the maintenance window to perform an AGC audio adjustment. In the example, of FIG. 11*b*, the audio data is normalized audio data. In an embodiment, for AC-3 audio, the audio samples have been processed by subtracting −28 dB from each sample. The target audio loudness after normalization therefore is 0 dB.

In the example of FIG. 11*b*, the minimum adjustment for AC-3 audio is 1 dB. The average of the 13 exemplary hourly data samples is −1.42 dB. Because this is not a valid adjustment, the value must be processed to determine a valid adjustment value. As has been described above, without limitation, a number of techniques to determine a valid adjustment step can be used. In the example of FIG. 11*b*, the determination of a valid adjustment step is performed by rounding the calculated adjustment to the nearest valid step. In this case, the nearest valid step is −1.0 dB. Because the target audio loudness is 0 dB, −1.42 dB indicates an average audio loudness is 1.42 dB below the target audio loudness. Thus, the AGC increases audio loudness by 1.0 dB to produce an output audio loudness of −0.42 dB. In an embodiment, all current samples stored in the TPS are increased by 1.0 dB as described above.

The adjustment can be applied as dialnorm in the BSI of the header associated with the AC-3 audio data. For example, in an embodiment, metadata inserter 120 in FIG. 1 inserts the 1.0 dB adjustment as the dialnorm value in the header of the AC-3 audio data.

In step 1008, the method determines whether the audio level adjustment is large enough for the audio data type. As described above, in an embodiment, the audio adjustment must be at least 2 dB for MPEG-1, layer II audio and at least 1 dB for AC-3 audio. In another embodiment, the audio adjustment must be at least 1 dB for MPEG-1, layer II audio and at least 0.5 dB for AC-3 audio. If the audio adjustment is not high enough, the method continues in step 1014 with no AGC adjustment, and then continues to step 1002, to collect new sample averages to calculate a new adjustment.

If the calculated audio adjustment is high enough, the audio level is adjusted. As described above, in an embodiment, the audio level is adjusted subject to certain constraints. For example, in an embodiment, the audio level can be increased by up to 6 dB and attenuated by up to −16 dB. As a result, in the example above, the actual adjustment determined in FIG. 11*a* would be further limited to 6 dB. For AC-3 audio, the audio level can be increased by up to 6 dB and attenuated by up to −6 dB.

To maintain consistency with the newly adjusted sample, in step 1012, the method adjusts all current samples in memory by the calculated adjustment. Making the adjustment all samples in memory avoids skewing the collected data going forward.

The order of the steps set forth in the method may not be important for all steps. For example, the average of the sample averages can be calculated prior to determining if the proper time within the maintenance window has been reached.

In an embodiment, parameters controlling operation of an audio loudness AGC according to an embodiment are variable. For example, in an embodiment, one or more parameters controlling audio loudness level AGC are stored in a configuration file. Exemplary parameters for audio loudness level control include, without limitation, AGC_Enable, AGC_Audio_Level_Compute_Interval, AGC_Audio_Level_Compute_Time, AGC_MPEG_Offset, AGC_AC-3_Offset. In an embodiment, AGC_Enable is set to "Yes" or to "No" to enable or disable AGC audio loudness level functionality respectively. In an embodiment, AGC functionality can be enabled and disabled on a per channel basis. In an embodiment, AGC_Audio_Level_Compute_Interval is used to set the interval for collecting audio data from the input stream. For example, as described above, AGC_Audio_Level_Compute_Interval is set to 5. In an embodiment, the AGC_Audio_Level_Compute_Interval is in seconds. In an embodiment, AGC_Audio_Level_Compute_Time is used to set the time of the maintenance window during which AGC adjustment is permitted to take place. In an embodiment, AGC_MPEG_Offset and AGC_AC-3_Offset are used to provide offsets (in dB) for MPEG-1, layer II audio and AC-3 audio respectively. For example, in an embodiment, AGC_MPEG_Offset is set to −26 dB and AGC_AC-3_Offset is set to −28 dB. In an embodiment, AGC_MPEG_AC-3_Offset is used to provide any inherent offset (in dB) between MPEG-1, layer II audio data and AC-3 audio data. For example, as described above, in an embodiment AGC_MPEG_AC-3_Offset is set to 6 dB. In an embodiment, parameters AGC_MPEG_Minimum_Adjustment and AGC_AC-3_Minimum_Adjustment establish the minimum valid adjustments (in dB) for AGC control of MPEG-1, layer II audio data and AC-3 audio data respectively. For example, in an embodiment, AGC_MPEG_Minimum_Adjustment and AGC_AC-3_Minimum_Adjustment are set to 2 dB and 1 dB respectively. In an embodiment, AGC_Rounding_Mode is used to select the rounding mode that is used to derive valid adjustment values from non-integral values. As described above, for example, rounding modes include, without limitation, truncation, rounding to 0, rounding to nearest integer, rounding to nearest valid step, dithering, and other rounding techniques. Other parameters can be provided as desired for a particular embodiment. In an embodiment, each of the parameters can be applied on a per channel and/or global basis. The foregoing parameters can be hard-coded or user-entered depending upon implementation.

In an embodiment, AGC operation can be monitored and status displayed to a user. FIG. 12 illustrates an exemplary AGC status window 1200 according to an embodiment. As illustrated in FIG. 12, AGC status window 1200 includes a status indication. Status indication of locked indicates that a synch is locked to process the audio data. AGC status window also includes status as to whether the AGC function is enabled, that is allowed to control audio loudness. Gain offset and normalized offset can displayed to a user in status window 1200. In an embodiment, the normalized offset is the target loudness baseline applied to move the baseline of the audio data to 0 dB. For example, in an embodiment, the normalized offset is −26 dB for MPEG-1, layer II audio data, and −28 dB for AC-3 audio data. Gain offset is the offset required currently applied to channel audio. Right and Left channel loudness can be provided to a user in status window 1200 and may be used to discover balance issues. In an embodiment, status window 1200 can also display the total loudness and average AGC gain. In an embodiment, the average AGC gain is an average of all 1-hour averages, and updates when AGC runs within the 8 am GMT window. As a result, it is most accurate just after and AGC adjustment time. In an embodiment, status window 1200 can display the number of AGC iterations that have been performed.

Figure 13:
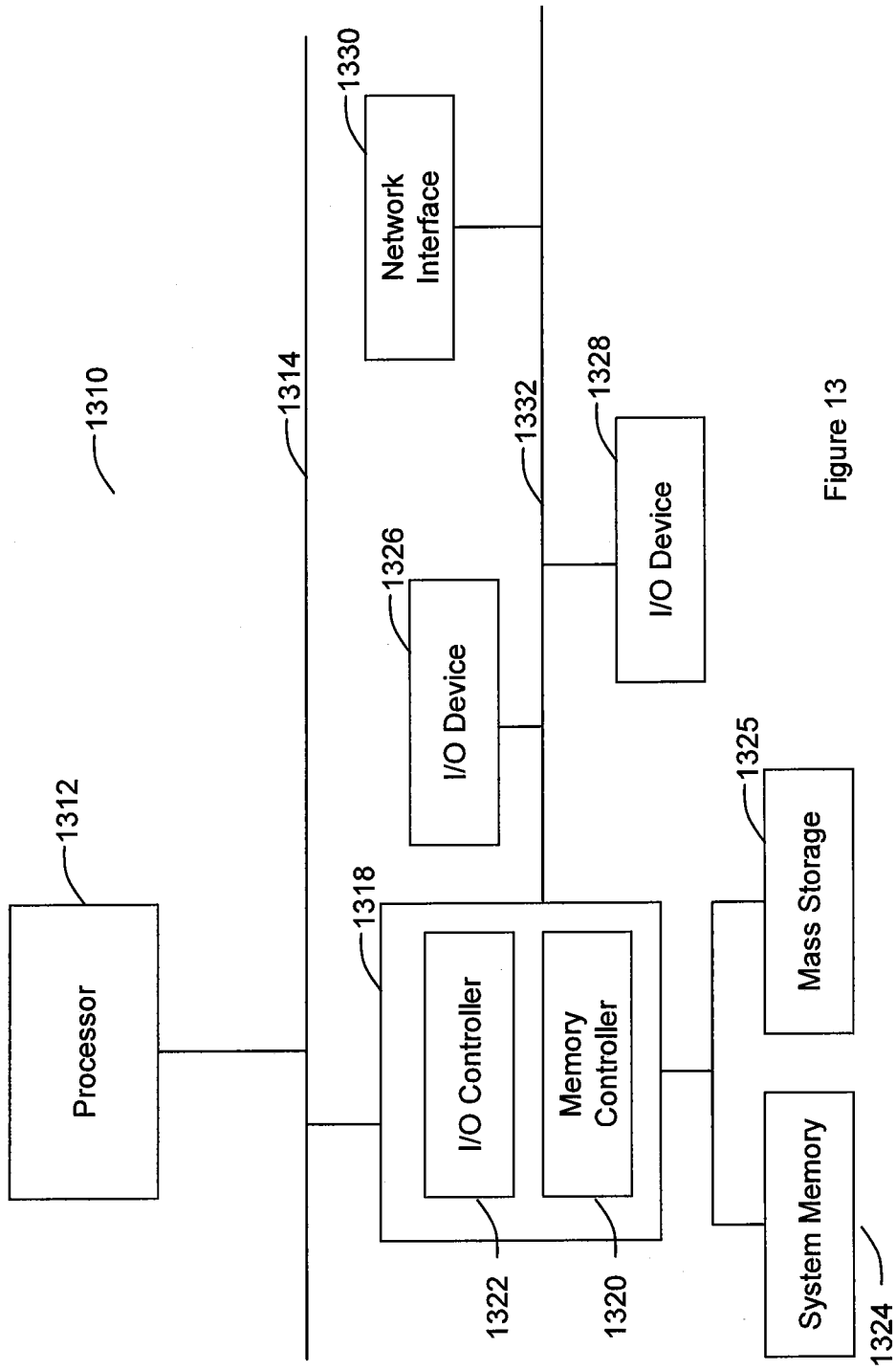
FIG. 13 is a block diagram of an example processor system that may be used to implement the apparatus and methods described herein according to an embodiment of the present invention.

FIG. 13 is a block diagram of an example processor system 1310 that may be used to implement the apparatus and methods described herein. As shown in FIG. 13, processor system 1310 includes a processor 1312 that is coupled to an interconnection bus 1314. Processor 1312 may be any suitable processor, processing unit or microprocessor. Although not shown in FIG. 13, system 1310 may be a multi-processor system and, thus, may include one or more additional processors that are identical or similar to processor 1312 and that are communicatively coupled to interconnection bus 1314.

Processor 1312 of FIG. 13 is coupled to a chipset 1318, which includes a memory controller 1320 and an input/output (I/O) controller 1322. As is well known, a chipset typically provides I/O and memory management functions as well as a plurality of general purpose and/or special purpose registers, timers, etc. that are accessible or used by one or more processors coupled to the chipset 1318. The memory controller 1320 performs functions that enable the processor 1312 (or processors if there are multiple processors) to access a system memory 1324 and a mass storage memory 1325.

System memory 1324 may include any desired type of volatile and/or non-volatile memory such as, for example, static random access memory (SRAM), dynamic random access memory (DRAM), flash memory, read-only memory (ROM), etc. The mass storage memory 1325 may include any desired type of mass storage device including hard disk drives, optical drives, tape storage devices, etc.

The I/O controller 1322 performs functions that enable the processor 1312 to communicate with peripheral input/output (I/O) devices 1326 and 1328 and a network interface 1330 via an I/O bus 1332. I/O devices 1326 and 1328 may be any desired type of I/O device such as, for example, a keyboard, a video display or monitor, a mouse, etc. Network interface 1330 may be, for example, an Ethernet device, an asynchronous transfer mode (ATM) device, an 802.11 device, a DSL modem, a cable modem, a cellular modem, etc. that enables processor system 1310 to communicate with another processor system.

While memory controller 1320 and I/O controller 1322 are depicted in FIG. 13 as separate blocks within chipset 1318, the functions performed by these blocks may be integrated within a single semiconductor circuit or may be implemented using two or more separate integrated circuits.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A system to process and display audio loudness data, comprising a monitor application executing on a computer to obtain audio loudness data stored at a remote location associated with a transport processing system located in a head end of a satellite broadcasting system, and prior to broadcast of a content stream from which the audio loudness data is derived to a set top box associated with a subscriber, the monitor application configured to obtain the data and store the data historically, and to process the historically stored data for display on a display to a user.

2. The system of claim 1, wherein the monitor stores data for a first interval of time at a first periodic rate and the monitor obtains the stored data for a second interval of time at a second periodic rate, wherein the second interval of time is less than the first interval of time.

3. The system of claim 2, wherein the monitor is configured to determine where there is overlapping data and to discard the overlapping data.

4. The system of claim 1, wherein the stored historical data is displayed to the user in tabular form.

5. The system of claim 1, wherein the monitor displays the data at the data sampling rate.

6. The system of claim 1, wherein the monitor displays an average of the data values in accordance with a step period.

7. The system of claim 1, further comprising a loudness data controller to control audio loudness in accordance with the data stored by the monitor.

8. The system of claim 7, wherein the loudness data controller uses audio automatic gain control (AGC).

9. The system of claim 8, wherein the AGC uses data sample averages to determine an average baseline and compares the average loudness baseline to a target loudness baseline to determine an adjustment.

10. The system of claim 9, wherein the adjustment is applied to a header in the audio data to control audio loudness.

11. A method for monitoring audio loudness in a transport processing system, comprising:

obtaining audio loudness data stored on the transport processing system that is located in a head end of a satellite broadcasting system prior to broadcast of a content stream from which the audio loudness data is derived to a set top box associated with a subscriber using a device located remotely to the transport processing system;

storing the obtained audio loudness data along with audio loudness data previously obtained from the transport processing system by the remote device so that a history of the audio loudness data obtained from the transport processing system is stored; and displaying the stored obtained audio loudness data to a user on a display.

12. The method of claim 11, further comprising storing the audio loudness data for a first interval of time at a first periodic rate and obtaining the stored data for a second interval at a second periodic rate, wherein the second interval of time is shorter than the first interval of time.

13. The method of claim 12, further comprising:
determining wherein there is overlapping data; and
discarding the overlapping data.

14. The method of claim 11, further comprising:
processing the obtained data prior to displaying the data to the user; and
displaying the stored history of the audio loudness data to the user in tabular form.

15. The method of claim 11, further comprising displaying the audio loudness data at a data sampling rate.

16. The method of claim 11, further comprising displaying an average of the audio loudness data in accordance with a step size.

17. The method of claim 11, further comprising controlling audio loudness in accordance with the obtained audio loudness data.

18. The method of claim 17, further comprising performing audio automatic gain control.

19. The method of claim 18, further comprising:
using data sample averages to determine an average baseline; and
comparing the average loudness baseline to a target loudness baseline to determine an adjustment.

20. The method of claim 19, further comprising applying the adjustment to a header in the audio data to control audio loudness.

* * * * *